(12) United States Patent
Tomisaka et al.

(10) Patent No.: US 8,263,490 B2
(45) Date of Patent: Sep. 11, 2012

(54) FORMATION METHOD OF METALLIC ELECTRODE OF SEMICONDUCTOR DEVICE AND METALLIC ELECTRODE FORMATION APPARATUS

(75) Inventors: Manabu Tomisaka, Nagoya (JP); Hidetoshi Katou, Komaki (JP); Yutaka Fukuda, Kariya (JP); Akira Tai, Okazaki (JP); Kazuo Akamatsu, Okazaki (JP); Yoshiko Fukuda, Kariya (JP); Yuji Fukuda, Osaka (JP); Mika Ootsuki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/923,576

(22) Filed: Sep. 28, 2010

(65) Prior Publication Data

US 2011/0207241 A1 Aug. 25, 2011

(30) Foreign Application Priority Data

Sep. 29, 2009 (JP) ................................ 2009-225323
Sep. 1, 2010 (JP) ................................ 2010-195812

(51) Int. Cl.
*H01L 21/44* (2006.01)

(52) U.S. Cl. . 438/666; 438/464; 257/737; 257/E21.508; 257/E21.599

(58) Field of Classification Search .................. 438/14, 438/16, 460, 464, 584, 597, 612, 613, 614, 438/666, 667; 257/737, 773, 781, E21.508, 257/E21.599

See application file for complete search history.

(56) References Cited

U.S. PATENT DOCUMENTS

| | | | |
|---|---|---|---|
| 7,910,460 B2 * | 3/2011 | Tomisaka et al. | 438/464 |
| 2004/0080734 A1 * | 4/2004 | Taniguchi et al. | 355/53 |
| 2008/0217771 A1 * | 9/2008 | Tomisaka et al. | 257/737 |
| 2010/0078543 A1 * | 4/2010 | Winker et al. | 250/201.9 |

FOREIGN PATENT DOCUMENTS

| | | |
|---|---|---|
| JP | A-11-74242 | 3/1999 |
| JP | A-2006-186304 | 7/2006 |

* cited by examiner

*Primary Examiner* — William D Coleman
*Assistant Examiner* — Su Kim
(74) *Attorney, Agent, or Firm* — Posz Law Group, PLC

(57) ABSTRACT

A formation method of a metallic electrode of a semiconductor device is disclosed. The method includes: acquiring data about surface shape of a surface part of a semiconductor substrate; and causing a deformation device to deform the semiconductor substrate based on the data so that a distance between a cutting plane and the surface part falls within a required accuracy in cutting amount. In deforming the semiconductor substrate, multiple actuators are used as the deformation device. A pitch of the multiple actuators is set to a value that is greater than one-half of wavelength of spatial frequency of a thickness distribution of the semiconductor substrate and that is less than or equal to the wavelength.

10 Claims, 12 Drawing Sheets

FORMATION METHOD OF METALLIC ELECTRODE OF SEMICONDUCTOR DEVICE AND METALLIC ELECTRODE FORMATION APPARATUS

CROSS REFERENCE TO RELATED APPLICATION

The present application is based on and claims priority of Japanese Patent Application No. 2009-225323 filed on Sep. 29, 2009 and Japanese Patent Application No. 2010-195812 filed on Sep. 1, 2010, disclosures of which are incorporated herein by reference. US Patent Application Publication No. 20080217771 corresponding Japanese Unexamined Patent Application Publication No. 2009-49356 is also incorporated herein by reference.

BACKGROUND OF THE INVENTION

1. Field of the Invention

The present invention relates to a method of forming a metallic electrode of a semiconductor device through patterning a metallic film by a cutting work. The present invention also relates to a metallic electrode formation apparatus.

2. Description of Related Art

As a low-cost formation technique of a metallic electrode for solder connection, Patent Document 1 describes a technique for forming a metallic electrode without conducting a photolithography process in patterning.

According to Patent Document 1, a semiconductor device includes a bed electrode formed on one surface of a semiconductor substrate, a protective film formed on the bed electrode, an opening formed in the protective film, and a metallic electrode for connection formed on a surface of the bed electrode exposed in the opening. The metallic electrode of the above semiconductor device is formed through forming a metallic film on the bed electrode and the protective film, and pattering the metallic film by a cutting work, which utilizes a difference in level between the surface of the bed electrode exposed in the opening and an upper surface of the protective film. More specifically, the difference in level is such a depression that the surface of the bed electrode exposed in the opening recedes from the upper surface of the protective film.

In formation of the above type of semiconductor devices, a part of the protective film is removed together with the metallic film above the protective film in order to reliably remove the metallic film located above the upper surface of the protective film even when the semiconductor substrate has a thickness variation. However, in order to ensure an electric insulating property of a semiconductor element in a semiconductor substrate and in order to suppress a variation in electric insulating property in a surface of the semiconductor substrate, it is necessary to ensure that the protective film has a predetermined thickness. Thus, when a metallic electrode is patterned by a cutting work, it may be preferable to conduct the cutting work with high accuracy in amount of cutting to an extent that, in the whole surface of the semiconductor substrate, a variation in amount of cutting with reference to a surface of the metallic film falls within +/−1 μm (2 μm or less). For example, when a bed electrode made of aluminum is formed to have a 5 μm thickness and when the protective film is formed to have a 10 μm thickness from one surface of the semiconductor substrate, the protective film has an approximately 8 μm thickness above the bed electrode. Therefore, the accuracy of 2 μm or less (within +/−1 μm) is required to ensure an approximately 3 μm film thickness of the protective film above the bed electrode, where the approximately 3 μm film thickness may be a minimum thickness required to ensure electric insulating reliability.

To conduct the cutting work, a semiconductor substrate is adsorbed and fixed on an adsorption stage. In this case, because the rear surface of the semiconductor substrate is deformed into a flat surface, the principle surface of the semiconductor substrate is deformed into a shape reflecting an original irregularity of the rear surface. The cutting work is typically conducted along a plane parallel to the adsorption stage. Therefore, if the semiconductor substrate has, with respect to the plane, a thickness variation larger than the above-described required accuracy (within +/−1 μm) in amount of cutting (cutting amount), there may exist a region where the required accuracy (+/−1 μm) in cutting amount is not satisfied. In this case, a yield rate is decreased.

In view of the above, the applicant of the present application has proposed a method described in Patent Document 2. According to Patent Document 2, after the semiconductor substrate having the metallic film is adsorbed and fixed on the adsorption stage, a surface shape measurement device acquires data about a surface shape of a surface part of the semiconductor substrate. In the above, the surface part is a part of the metallic film that covers the protective film. Then, based on the data about the surface shape, a deformation device deforms the semiconductor substrate by applying displacement to the semiconductor substrate from an adsorption stage side of the semiconductor substrate so that a distance between the surface part of the semiconductor substrate and a cutting plane, which is set parallel to the adsorption stage, falls within a predetermined range. Then, the surface shape measurement device measures the surface shape of the deformed semiconductor substrate. When it is determined that the distance between the surface part and the cutting plane is in the predetermined range, the cutting work is conducted along the cutting plane while the semiconductor substrate deformed by the deformation device is being adsorbed and fixed on the adsorption stage. As described above, since the cutting work is conducted in a state where irregularity of the surface part of the semiconductor substrate has become smaller, it is possible to improve the yield rate.

Patent Document 1: JP-2006-186304A

Patent Document 2: JP-2009-49356A corresponding to US-2008/0217771A

However, Patent Document 2 fails to specifically address an arrangement of multiple actuators acting as the deformation device. Therefore, depending on the arrangement of the multiple actuators, it is likely that the irregularity of the surface part of the semiconductor substrate cannot be corrected with high accuracy. That is, undulation of the semiconductor substrate cannot be corrected with high accuracy. In order to correct the undulation of the surface of the semiconductor substrate with high accuracy, it may be preferable to decrease a pitch of the actuators. However, the decrease in the pitch leads to an increase in the number of actuators. In accordance with the increase in the number of actuators, a control system is complicated and production cost is increased.

According to a known sampling theorem, when the actuators are arranged at a pitch less than or equal to one-half of wavelength corresponding to spatial frequency of the undulation of the surface of the substrate, the undulation can be recovered by a chain of the displacements of the actuators. That is, it is conceivable that when the actuators are arranged ideally based on the sampling theorem, an upper limit of the pitch of the actuators capable of correcting the undulation with high accuracy is one-half of wavelength of spatial frequency of the undulation of the semiconductor substrate.

SUMMARY OF THE INVENTION

In view of the above difficulty, it is an objective of the present invention to provide a metallic electrode formation apparatus and a formation method of a metallic electrode of a semiconductor device, the apparatus and the method being capable of reducing production cost while a required accuracy in cutting amount is being satisfied.

According to a first aspect of the present invention, a formation method of a metallic electrode of a semiconductor device includes: forming a bed electrode on a principle surface of a semiconductor substrate so that the bed electrode is electrically connected with a semiconductor element; forming a protective film covering the bed electrode, and then forming an opening in the protective film, so that a surface of the bed electrode is exposed in the opening; forming a metallic film covering the protective film and the surface of the bed electrode exposed in the opening; mounting the semiconductor substrate having the metallic film to an adsorption stage so that the semiconductor substrate is adsorbed and fixed on the adsorption stage; acquiring data about a surface shape of a surface part of the semiconductor substrate through causing a surface shape measurement device to measure the surface shape of the semiconductor substrate after the semiconductor substrate is adsorbed and fixed on the adsorption stage, wherein the surface part of the semiconductor substrate is a part of the metallic film, the part covering the protective film, wherein the surface shape measurement device is located on a side of the principle surface of the semiconductor substrate; deforming the semiconductor substrate based on the acquired data about the surface shape through causing a deformation device to apply displacement to the fixed semiconductor substrate via the adsorption stage so that a distance between a cutting plane and the surface part of the semiconductor substrate falls within a predetermined range, wherein the cutting plane is set so that the adsorption stage before being deformed is parallel to the cutting plane; determining whether the distance between the cutting plane and the surface part of the deformed semiconductor substrate is in the predetermined range, through letting the surface shape measurement device to measure the surface shape of the surface part of the deformed semiconductor substrate; and forming a metallic electrode through patterning the metallic film when it is determined that the distance between the cutting plane and the surface part of the deformed semiconductor substrate is in the predetermined range, wherein the pattering the metallic film includes conducting a cutting work along the cutting plane, with the deformed semiconductor substrate being adsorbed and fixed to the adsorption stage.

In this formation method, multiple actuators are used as the deformation device. Respective displacements of the multiple actuators are controllable. Further, the multiple actuators are arranged so that the multiple actuators abut on a rear surface of the adsorption stage to apply the displacements to the semiconductor substrate via the adsorption stage and a pitch of the multiple actuators is greater than one-half of minimum wavelength of spatial frequency of a thickness distribution of the semiconductor substrate, and is less than or equal to the minimum wavelength.

According to a second aspect of the present invention, a metallic electrode formation apparatus for forming a metallic electrode through cutting a metallic film, which is formed to cover a protective film and a bed electrode exposed in an opening of the protective film, along a cutting plane is provided. The bed electrode is on a principle surface of a semiconductor substrate. The metallic electrode formation apparatus includes: an adsorption stage on which the semiconductor substrate is to be adsorbed and fixed; and multiple of actuators arranged to abut on a rear surface of the adsorption stage to apply displacements to the semiconductor substrate via the adsorption stage. The adsorption stage before being deformed is parallel to the cutting plane. The multiple actuators are arranged at a pitch that is greater then one-half of minimum wavelength of spatial frequency of thickness distribution of the semiconductor substrate, and that is less than or equal to the minimum wavelength.

In the course of making the present invention, the inventors of the present application measured a thickness variation of a semiconductor substrate in which a metallic film had been formed. Based on a result of this measurement, the inventors revealed a distribution of amplitude of undulation of a surface of the semiconductor substrate, a distribution of wavelength of the undulation, and a distribution of spatial frequency of the undulation. Then, the inventors studied a relationship between a pitch of actuators and the undulation of the surface of the semiconductor substrate. As a result, the inventors have found out that even when the pitch of actuators is greater than one-half of the minimum wavelength of the spatial frequency of the thickness distribution of the semiconductor substrate and is less than or equal to the minimum wavelength, it is possible to satisfy the required accuracy in cutting amount. The above formation method and the above metallic electrode formation method are based on these studies. According to the above formation method and the above metallic electrode formation method, it is possible to reduce the number of actuators compared to a case where the pitch of actuators is less than or equal to one-half of the minimum wavelength. Therefore, it is possible to reduce production cost while the required accuracy (e.g., within $+/-1$ μm) in cutting amount is being satisfied. It should be noted that when the pitch of the actuators was larger than the minimum wavelength in the spatial frequencies, the undulation was not fully corrected, and the required accuracy in cutting amount could not be satisfied.

According to the above formation method and the metallic electrode formation apparatus, it is possible to form the metallic electrode through patterning the metallic film by a cutting work. To conduct the cutting work, the following may be performed. While the semiconductor substrate having the metallic film is being adsorbed and fixed on the adsorption stage, the surface shape measurement device acquires the data about the surface shape of the surface part of the semiconductor substrate and the multiple actuators of the deformation device deforms the semiconductor substrate so that the distance between the cutting, plane and the surface part of the semiconductor substrate falls within the predetermined range. Then, the surface shape of the deformed semiconductor substrate is measured with the surface shape measurement device in order to determine whether the distance between the cutting plane and the surface part of the semiconductor substrate is in the predetermined range. When it is determined that the distance between the cutting plane and the surface portion of the semiconductor substrate is in the predetermined range, the cutting work is conducted along the cutting plane in a state where the semiconductor substrate deformed by the deformation device is adsorbed and fixed on the adsorption stage. Therefore, when the surface shape of the semiconductor substrate reflects a shape of the rear surface due to the adsorption and fixation of the semiconductor substrate on the adsorption stage and when a concavo-convex difference of the surface part is increased, it is possible to decrease the concavo-convex difference of the surface part of the semiconductor substrate and it is possible to put the distance between the cut plane and the surface part of the semiconductor substrate in the predetermined range (i.e., the required accuracy in cutting amount).

Moreover, since the deformation device includes the multiple actuators whose respective displacements are controllable, the multiple actuators can apply the displacements to the semiconductor substrate according to a deformation state of the semiconductor substrate. Therefore, it is possible to control the surface shape of the semiconductor substrate with high accuracy.

Moreover, since the multiple actuators of the deformation device are arranged to abut on the rear surface of the adsorption stage and are configured to apply displacements to the semiconductor substrate via the adsorption stage, it is possible to prevent the deformation device from generating local stress in the semiconductor substrate and it is possible to prevent the semiconductor substrate from locally deforming.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF EMBODIMENTS

Embodiments of the present invention will be described below with reference to the accompanying drawings.

First Embodiment

A first embodiment will be described. A characteristic point of the present embodiment can be an arrangement of actuators when a metallic electrode of a semiconductor device is formed by a cutting work. Other points can be basically similar to those described in Patent Document 2, the applicant of which is the same as the present application. Therefore, duplicative points between the present application and Patent Document 2 may be described simply, and the arrangement of actuators may be described in detail.

Figure 1:
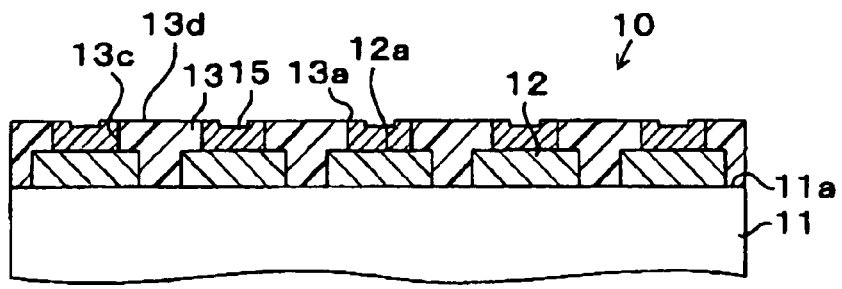
FIG. 1 is a sectional view schematically illustrating a semiconductor device in which a metallic electrode is formed by using a metallic electrode formation method and a metallic electrode formation apparatus according to a first embodiment.

FIG. 1 is a sectional view illustrating a semiconductor device having a metallic electrode, which is formed by a metallic electrode formation method of the first embodiment. FIGS. 2A, 2B, 2C, 3A, 3B, 4A and 4B are sectional views illustrating steps of the metallic electrode formation method in a temporal order. FIGS. 5A and 5B are diagrams illustrating a surface shape control apparatus applied to the metallic electrode formation method. FIG. 5A is a sectional view and FIG. 5B is a plan view viewed from a semiconductor substrate side. FIG. 7 is a sectional view illustrating a semiconductor device in which a heat sink is connected with the metallic electrode via solder. It should be noted that, for illustrative purpose, some parts may be enlarged and some parts may be omitted in the drawings.

As shown in FIG. 1, a semiconductor device 10 includes a semiconductor substrate 11, a bed electrode 12, a protective film 13 and a metallic electrode 15. The semiconductor substrate 11 is made of silicon or the like, and has an element. The bed electrode 12 is formed on a principle surface 11a of the semiconductor substrate 11 and configured as an electrode of the element. The protective film 13 is made of an insulating material, and covers a part of the principle surface 11a and a part of the bed electrode 12. The metallic electrode 15 is connected with the bed electrode 12 via an opening 13a formed in the protective film 13.

The element (i.e., semiconductor element) formed in the semiconductor device 10 is not limited to a specific element. In the present embodiment, the element may be a vertical transistor element, in which a current flows in a thickness direction of the semiconductor substrate 11 made of silicon. For example, the vertical transistor element is an IGBT (insulated gate bipolar transistor). Alternatively, the vertical transistor element may be a vertical MOSFET (metal-oxide semiconductor field-effect transistor) or the like. Such a vertical transistor element with a gate is used as, for example, a power device disposed in an inverter for driving a load. The semiconductor device 10 including this kind of a semiconductor substrate 11 is used for so called a power card.

The bed electrode 12 is a part of an electrode electrically connected with the element, which part is in contact with or connected with the element. In the present embodiment, the bed electrode 12 is made of an Al material, while the semiconductor substrate is made of silicon. The Al material is for example Al alloy such as Al, Al—Si, Al—Si—Cu and the like. Some bed electrodes 12 are connected with emitters or gates of the IGBTs formed in the semiconductor substrate 11. All of the bed electrodes 12 shown in FIG. 1 are connected with the emitters. In the followings, the bed electrodes 12 connected with the emitters are described as examples of the bed electrode 12. The protective film 13 is, for example, made of polyimide resin and has a thickness of a few μm to 20 μm. The protective film 13 has an opening 13a for exposing the bed electrode 12. The surface 12a of the bed electrode 12 bared (i.e., exposed) from the opening 13a recedes from the upper surface 13b of the protective film 13, so that a difference in level (level difference) is formed between the surface 12a of the bed electrode 12 and the upper surface 13b of the protective film 13.

The metallic electrode 15 is another part of the electrode electrically connected with the element, which another part is to have connection to another part via a member such as a solder, a wiring and the like. In the present embodiment, the metallic electrode 15 is formed only inside the opening 13a, so that the metallic electrode 15 covers the surface 12a of the bed electrode 12, which is exposed through the opening 13a, and a side surface 13c of the protective film 13, which forms the difference in level. The metallic electrode 15 is formed through laminating a Ti film, a Ni film and an Au film in this order from the bed electrode 12. However, a film structure of the metallic electrode 15 is not limited to the above-described example. For example, the film structure may be a multilayer structure in which a Ni film and an Au film are laminated in this order from the bed electrode 12. Alternatively, the metallic electrode 15 may be a single-layered metallic film. A NiV film may be used in place of the Ni film.

Figure 2A:
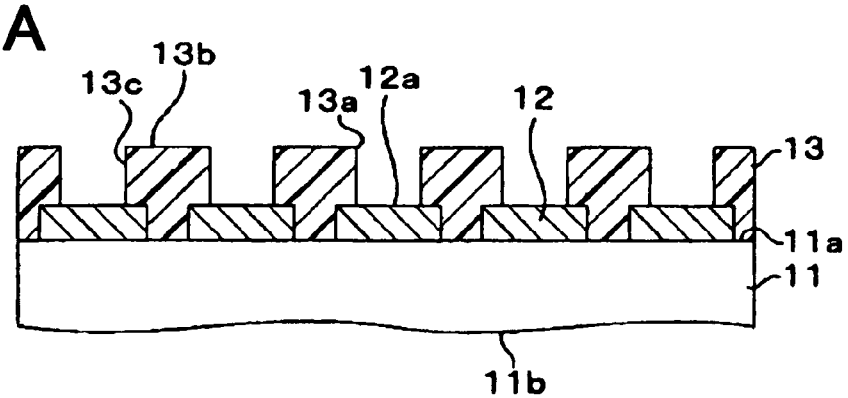
FIGS. 2A to 2C are sectional views each illustrating a step in the metallic electrode formation method.

A formation method of the metallic electrode 15 will be described below. First, as shown in FIG. 2A, the semiconductor substrate 11 having the element (not shown) is prepared. In the present embodiment, a principle surface side part (e.g., emitter, gate) of the IGBT is formed in a principle surface side part of a silicon wafer, which corresponds to the semiconductor substrate 11. Then, the wafer is grinded from the rear surface 11b of the wafer in a state where a protection tape is attached to the principle surface 11a, so that the thickness of the wafer is decreased to a value in a range between approximately 100 μm and approximately 200 μm. The grinding is conducted in order to reduce an on-state resistance of the element (e.g., IGBT). After the wafer is grinded, a rear surface side part (e.g., collector) of the IGBT is formed in a rear surface side part of the wafer, and a rear surface side electrode (e.g., collector electrode) is formed on the rear surface of the wafer. Through the above processes, the semiconductor substrate 11 is prepared. A reason why the rear surface side part of the element and the rear surface side electrode are formed prior to formation on a principle surface side electrode (e.g., the bed electrode 12 and the metallic electrode 15) is to prevent, when the metallic electrode 15 is formed, an exposed rear surface side part of the wafer from being polluted by a material (e.g., Au) of the metallic electrode 15.

As described above, before the formation of the bed electrode 12, the semiconductor substrate 11 is grinded from the rear surface 11b, so that the semiconductor substrate 11 has a predetermined thickness. The protection tape used in the grinding the rear surface of the wafer has a thickness variation in a surface attached to the wafer. For example, the protection tape may have a thickness variation of approximately a few μm (1 μm to 3 μm) in the surface attached to the wafer. A thickness variation among production lots may be approximately 5 μm. Therefore, after the grinding, the thickness variation of the protection tape is transferred to the silicon wafer (corresponding to the semiconductor substrate 11) from which the protection tape has been removed. A part of the silicon wafer corresponding to a thicker part of the protection tape is thin and another part of the silicon wafer corresponding to a thin part of the protection tape is thick. According to studies of the inventors of the present application, the following is confirmed. When wafers having a diameter of approximately 200 mm (i.e., in a range between 100 mm and 300 mm) are grinded to a thickness of approximately 120 μm (i.e., in a range between 50 μm and 300 μm), a variation in height of the surface parts 11c of the semiconductor substrates 11 is approximately 7.5 μm in 8σ in a time when the metallic film 14 has already been formed but the cutting work has not been conducted yet. The height variation of the surface parts 11c of the semiconductor substrates 11 is approximately 5.5 μm in 8σ when the bed electrodes 12 have just been formed after the grinding. From the above results, it is confirmed that the transfer of the thickness variation of the protection tape is a main factor of the thickness variation of the semiconductor substrate 11. The variation in height of the surface part 11c is also referred to herein as a concavo-convex difference.

Description now returns to the formation method of the metallic electrode 15. The bed electrode 12 is formed through forming an Al—Si film on the principle surface 11a of the prepared semiconductor substrate 11 by a sputtering method and patterning the Al—Si film by a photolithography process. The protective film 13 made of polyimide resin is formed over a whole principle surface 11a of the semiconductor substrate, so that the protective film 13 covers the bed electrode 12 and has a thickness of approximately 10 μm. The opening 13a for exposing the bed electrode 12 is formed at a predetermined part of the protective film 13. The opening 13a is formed in such manner that the predetermined part is opened from the surface of the protective film 13 toward the bed electrode 12 by a photolithography process. Since a resin material is used as a material of the protective film 13, the protective film 13 can properly cover the thick bed electrode 12. After the formation of the opening 13a, the surface 12a of the bed electrode 12 exposed through the opening 13a recedes from the upper surface 13b of the protective film 13. That is, the level difference is formed between the surface 12a of the bed electrode 12 and the upper surface 13b of the protective film 13.

Figure 2B:
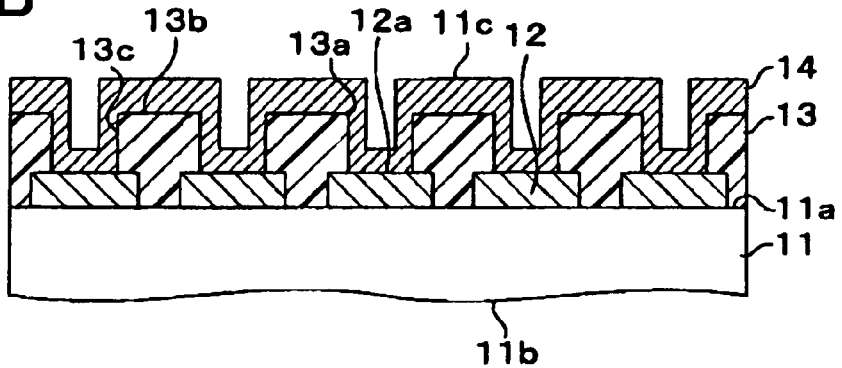

After the protective film 13 and the opening 13a are formed, as shown in FIG. 2B, the metallic film 14 is formed by a sputtering method or the like, so that the metallic film 14 covers the bed electrode 12, the upper surface 13b of the protective film 13, and the side surface 13c of the protective film 13. In the present embodiment, a Ti film, a NiV film and a Au film are laminated in this order thereby to form the metallic film 14. In the metallic film 14, Vanadium "V" of the NiV film acts as a barrier layer against solder.

Figure 2C:
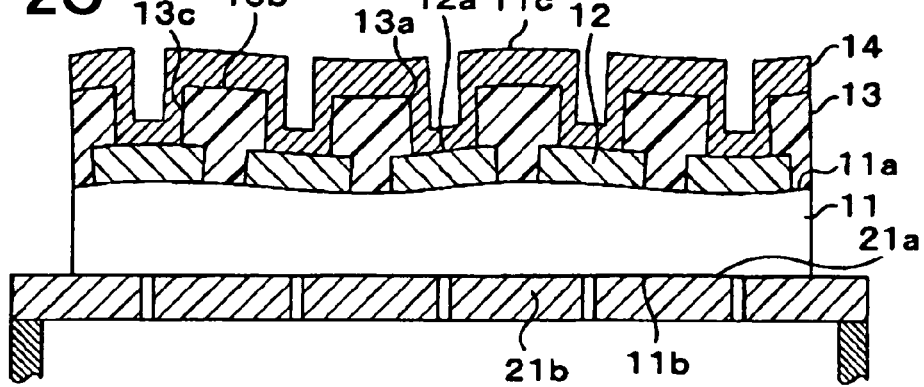

After the metallic film 14 is formed, the semiconductor substrate 11 is placed on the adsorption stage 21b of a surface shape control apparatus 20 (see FIGS. 5A and 5B) so that the rear surface 11b of the semiconductor substrate 11 is adsorbed and fixed on an adsorption surface 21a of the adsorption stage 21b, as shown in FIG. 2C. In this case, an adsorption force generated at the adsorption surface 21a flattens the rear surface 11b of the semiconductor substrate 11, and as a result, the surface part 11c of the semiconductor substrate 11 has a large irregularity that reflects the original irregular shape of the rear surface 11b of the semiconductor substrate 11. It should be noted that "the surface part 11c" refers to a part of the metallic film 14 that covers the upper surface 13b of the protective film 13. Further, "the surface shape" refers to a profile of irregularity of the surface part 11c. The surface shape corresponds to a profile of a distance between the surface part 11c and the later-described cutting plane "P".

Now, a configuration of the surface shape control apparatus 20 is described below with reference to FIGS. 5A and 5B. The surface shape control apparatus 20 includes: a stage 21 to which the semiconductor substrate 11 is mountable; an adsorption device 22 for adsorbing and fixing the semiconductor substrate 11; a surface shape measurement device 23 for measuring a shape of the surface part 11c of the semiconductor substrate 11; a deformation device 24 for deforming the semiconductor substrate 11 from the rear surface 11b; and a control computer 25 for controlling the foregoing devices. The deformation device 24 can act as a metallic electrode formation apparatus.

The stage 21 includes the adsorption stage 21b and the lower stage 21c. The stage 21 has a hollow portion 21d between the adsorption stage 21b and the lower stage 21c. Thus, the stage 21 has a hollow shape structure. The adsorption stage 21b has the adsorption surface 21a, on which the semiconductor substrate 11 is to be adsorbed and fixed. The adsorption stage 21b has an adsorption hole 21e for applying the adsorption force to the semiconductor substrate 11. The adsorption force is generated when the hollow portion 21d is depressurized by the adsorption device 22, which includes a vacuum pump or the like.

The adsorption stage 21b is easily deformable in order for the deformation device 24 to apply the displacements to the semiconductor substrate 11. The adsorption stage 21b is made with a stainless steel (abbreviated to SUS) having a plate shape with a 0.5 mm to 3 mm thickness. By interposing this kind of adsorption stage 21b, it is possible to smoothly link the displacements of the piezoelectric actuators 24a to each other. The lower stage 21c has a depressurization hole 21f, which is coupled with the adsorption device 22. To the lower stage 21c, the deformation device 24 is mounted.

In the present embodiment, multiple piezoelectric actuators 24a are used as the deformation device 24. The multiple piezoelectric actuators 24a are arranged in a lattice at a predetermined pitch. The multiple piezoelectric actuators 24a are touchable on a rear surface 21g of the adsorption stage 21b and can generate upward displacements. The arrangement of the multiple piezoelectric actuators 24a is a characteristic point of the present embodiment, which will be specifically described later. FIGS. 3A, 3B, 4A, 5A and 5B illustrate one example case where sixteen piezoelectric actuators 24a are arranged in a lattice with four piezoelectric actuators 24a in each longitudinal low and four piezoelectric actuators 24a in each lateral low. Respective piezoelectric actuators 24a can independently, control the displacements under control of the control computer 25, and can generate the displacements different from each other. Advantage of the piezoelectric actuators 24a includes high accuracy in control of displacement, less backlash, and small heat generation in operation. In the present embodiment, a stroke of each piezoelectric actuator 24a is 19 μm.

When the piezoelectric actuator 24a generates the upper displacement, the piezoelectric actuator 24a can apply the upward displacement to the semiconductor substrate 11 via the adsorption stage 21b and can deform the semiconductor substrate 11. Because the piezoelectric actuator 24a can apply the displacement to the semiconductor substrate 11 via the adsorption stage 21b, it is possible to prevent the piezoelectric actuator 24a from generating local stress in the semiconductor substrate 11, and it is possible to prevent the semiconductor substrate 11 from locally deforming. In the present embodiment, it is, also possible to apply downward displacement to the semiconductor substrate 11 by using negative pressure, which is generated by the adsorption device 22.

The surface shape control apparatus 20 may be configured such that an upper end of the deformation device 24 may be joined with the rear surface 21g of the adsorption stage 21b. In this configuration, no play arises when the deformation device 24 applies the upward displacement to the semiconductor substrate 11. Moreover, the deformation device 24 can further apply the downward displacement to the semiconductor substrate 11 via the adsorption stage 21b.

The surface shape measurement device 23 measures the surface shape of the surface part 11c of the semiconductor substrate 11. In the present embodiment, a laser displacement meter is used as the surface shape measurement device 23. With use of the laser displacement meter, it is possible to conduct contactless measurement of the surface shape with high accuracy, and it is possible to shorten a measurement time. Data about the surface shape of the surface part 11c measured with the surface shape measurement device 23 is outputted to the control computer 25.

Figure 3A:
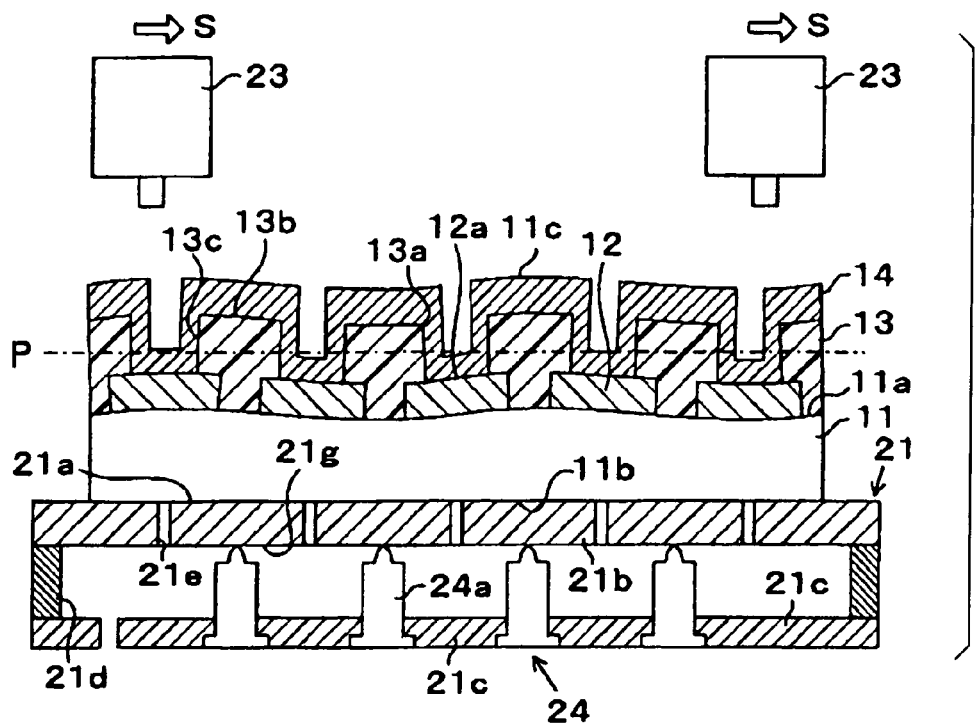
FIGS. 3A and 3B are sectional views each illustrating a step in the metallic electrode formation method.

After the semiconductor substrate 11 is adsorbed and fixed on the adsorption surface 21a of the adsorption stage 21b, the surface shape of the surface part 11c of the semiconductor substrate 11 is measured with the surface shape measurement device 23, as shown in FIG. 3A. In this case, points to be measured are set on the surface part 11c of the semiconductor substrate 11 so that the points to be measured are arranged in a lattice. The surface shape measurement device 23 scans along a plane parallel to the cutting plane "P" to measure the thickness of the semiconductor substrate 11, and outputs data about the measured points to the control computer 25. Then, based on the data about the measured points, the control computer 25 interpolates data between the measured points, thereby building surface shape data (i.e., data about the surface shape) of the surface part 11c of the semiconductor substrate 11. The cutting plane "P" is parallel to the adsorption stage 21b before the displacements are applied via the adsorption stage 21b. In order to surely remove a part of the metallic film 14 located above the upper surface 13a of the protective film 13, the cutting plane "P" is set at such a predetermined height that the part of the protective film 13 is removed. The cutting plane "P" is set between the upper surface 13b of the protective film 13 and the principle surface 11a of the semiconductor substrate 11.

As shown by the straight line "S" in FIG. 5B, the surface shape measurement device 23 scans on the surface part 11c along the straight line "S" so that the points to be measured include at least points to which the deformation device 24 applies the displacements.

According the above manner, since it is possible to measure the points at which displacements can be largest, it is possible to improve accuracy in measurement of the surface shape. The number of points to be measured may be larger than the number of piezoelectric actuators 24a. In this case, since it is possible to measure a region between the multiple piezoelectric actuators 24a and since it is possible to increase the number of points to be measured used to interpolate the data between the piezoelectric actuators 24a, it is possible to improve the accuracy in measurement of the surface shape.

Figure 3B:
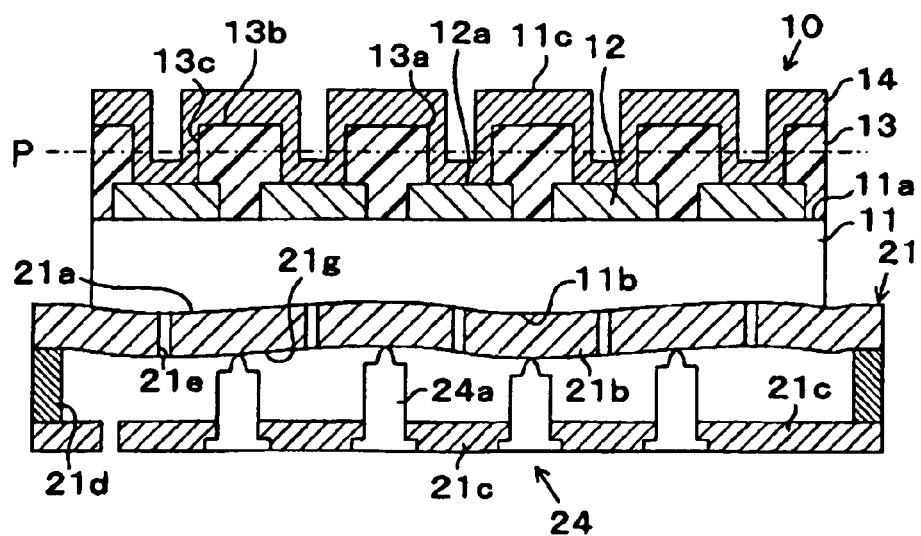

After acquisition of the data about the surface shape, as shown in FIG. 3B, the deformation device 24 applies the displacements to the semiconductor substrate 11 from the rear surface 11b of the semiconductor substrate 11, deforms the semiconductor substrate 11 and controls the surface shape so that a variation in distance between the cutting plane "P" and the surface part 11c falls within the below-descried accuracy required in cutting work. That is, the semiconductor substrate 11 is deformed so that the concavo-convex difference of the surface part 11c falls within the required accuracy in cutting amount.

More specifically, based oh the data about the surface shape built by the control computer 25, the control computer 25 controls respective amounts of the displacements of the piezoelectric actuators 24a of the deformation device 24 and the deformation device 24 applies the displacements to the rear surface 11b of the semiconductor substrate 11 via the adsorption stage 21b so that the concavo-convex difference of the surface part 11c falls within the required accuracy in cutting amount (+/−1 μm or less). A relationship between the displacements of respective piezoelectric actuators 24a of the deformation device 24 and a deformation amount of the semiconductor substrate 11 can prospectively acquired by numerical simulations or actual measurements.

After the displacements are applied to the semiconductor substrate 11, the surface shape measurement device 23 measures the surface shape of the surface part 11c of the semiconductor substrate 11, and the control computer 25 determines whether the variation in distance between the cutting plane "P" and the surface part 11c falls within the required accuracy in cutting work. In the present embodiment, it is determined whether the concavo-convex difference of the surface part 11c falls within +/−1 μm.

Figure 4A:
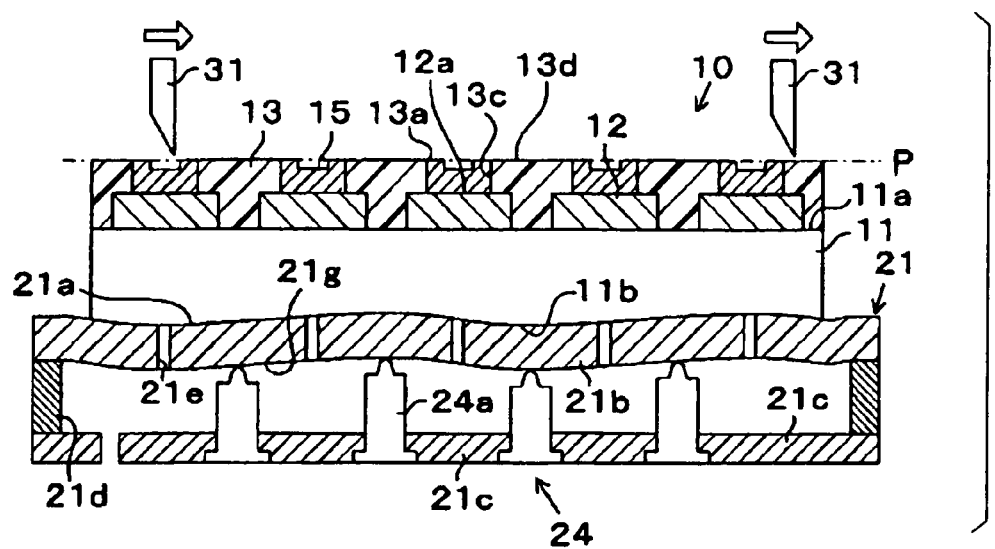
FIGS. 4A and 4B are sectional views each illustrating a step in the metallic electrode formation method.
Figure 5A:
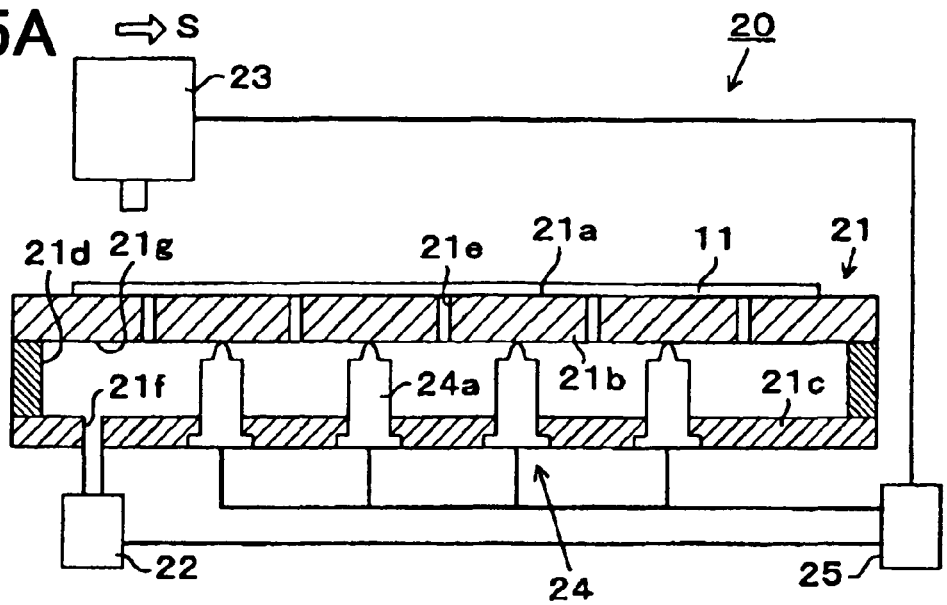
FIG. 5A is a sectional view schematically illustrating a surface shape measurement device.
Figure 5B:
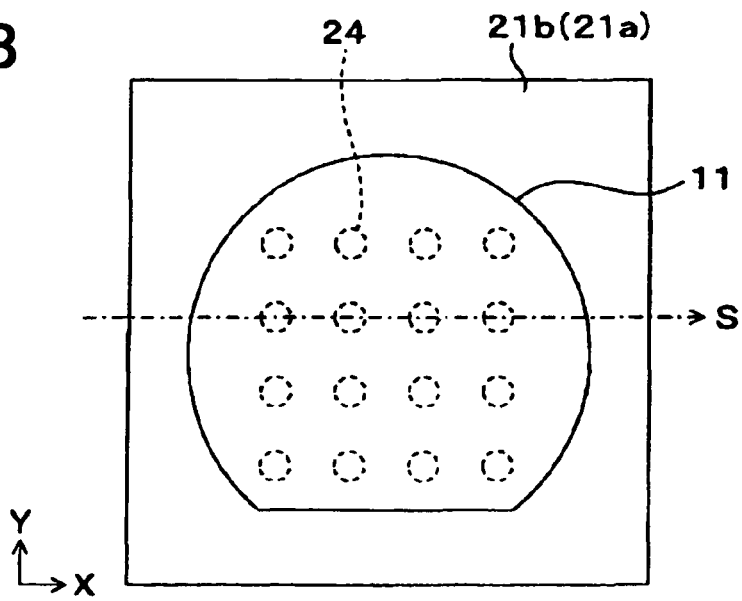
FIG. 5B is a plan view illustrating a semiconductor substrate viewed from an opposite side from actuators.

When the control computer 25 determines that the variation in distance between the cutting plane "P" and the surface part 11c falls within the required accuracy in cutting work, the cutting work is then conducted from a surface of the metallic film 14 using a cutting tool 31 (e.g., tool bit) to pattern the metallic film 14, and the metallic electrode 15 is formed, as shown in FIG. 4A. In the present embodiment, a part of the metallic film 14 and a part of the protective film 13 (i.e., parts in the vicinity of the upper surface 13b) are removed by the cutting work, and an upper surface 13d newly appears. A relative speed between the cutting tool 31 and the semiconductor device 10 is set to 20 m/s and a pitch of the cutting work is set to 70 μm. Accuracy in height of the cutting tool 31 relative to the metallic film 14 is less than +/−1 μm.

By conducting the cutting work throughout the whole principle surface 11a of the semiconductor substrate 11 under the above-described cutting condition, it is possible to remove a part of the metallic film 14 located above the upper surface 13b of the protective film 13, and it is possible to form the metallic electrode 15 by performing such a patterning process that leaves only another part of the metallic film 14 located inside the opening 13a. That is, the metallic electrode 15 is formed so that the metallic electrode 15 covers the surface 12a of the bed electrode 12 exposed from the opening 13a and the side surface 13c of the protective film 13 causing the level difference.

Figure 4B:
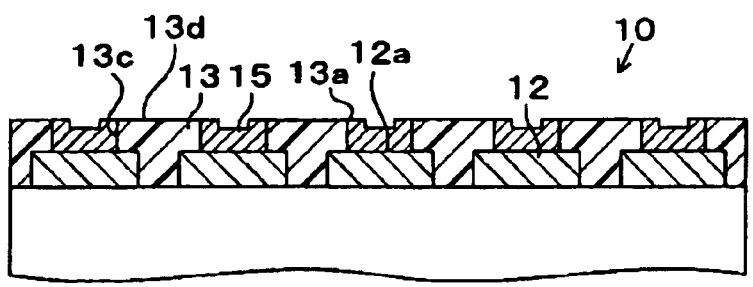

Then, as shown in FIG. 4B, the piezoelectric actuators 24a are stopped from applying the displacements, and the semiconductor substrate 11 is detached from the stage 21. As a result, the metallic electrode 15 is formed in the semiconductor substrate 11.

According to the above-described steps, by conducting the cutting work throughout the whole principle surface 11a of the semiconductor substrate 11, it is possible to form the metallic electrode 15 through patterning the metallic film 14 so the a part of the metallic film 14 located above the upper surface 13b of the protective film 13 is removed and another part of the metallic film 14 located inside the opening 13a is only left. The formed metallic electrode 15 covers the surface 12a of the bed electrode 12 exposed from the opening 13a and the side surface 13c of the protective film 13 forming the level difference. Therefore, it is possible to increase strength of the metallic electrode 15, compared to a case where the metallic electrode 15 is formed only on the surface 12a of the bed electrode 12.

Moreover, even when the adsorption and fixation of the semiconductor substrate 11 on the adsorption stage 21b increases the concavo-convex difference of the surface part 11c of the semiconductor substrate 11 in accordance with the shape of the rear surface 11b, the use of the deformation device 24 decreases the concavo-convex difference of the surface part 11c of the semiconductor substrate 11. Therefore, it is possible to improve processing accuracy in cutting work and it is possible to improve production yield rate in the metallic electrode formation.

Figure 6:
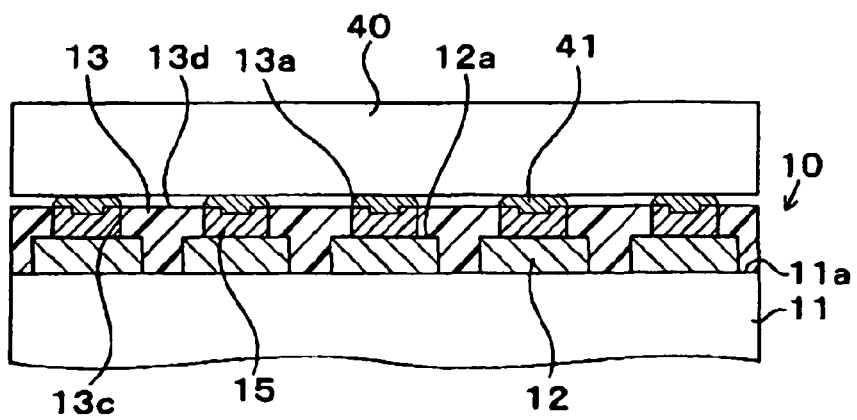
FIG. 6 is a sectional view schematically illustrating a semiconductor device to which a heat sink is connected via solder.

The metallic electrode 15 of the semiconductor device 10 formed in the above way is connected to another part via a member such as solder, wiring and the like. For example, as shown in FIG. 6, the metallic electrode 15 may be used as an emitter electrode, which may occupy most of the principle surface 11a of the semiconductor substrate 11. A heat sink 40 may be joined with the metallic electrode 15 via a solder 41. Since a surface of the metallic electrode has a recession part, it is possible to increase an area for making contact with the solder 41, and as a result, it is possible to increase joint strength of the solder 41.

According to the above-described metallic electrode formation method, however, depending on the arrangement of the piezoelectric actuators 24a, the irregularity of the surface part 11c of the semiconductor substrate 11 cannot be corrected with high accuracy, i.e., the undulation of the semiconductor substrate 11 cannot be corrected with high accuracy. FIGS. 6A to 6C are diagrams illustrating a relationship between the undulation of the surface part of the semiconductor substrate and a pitch of the piezoelectric actuators.

Figure 7A:
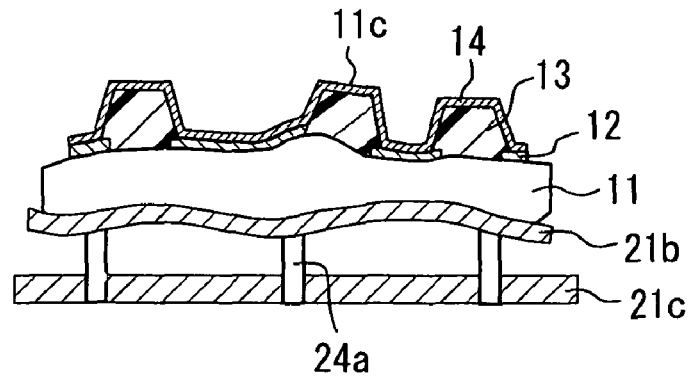
FIGS. 7A to 7C are diagrams schematically illustrating a relationship between a pitch of piezoelectric actuators and undulation of a surface part of a semiconductor substrate.

The pitch of the piezoelectric actuators 24a is a distance between the centers of the adjacent piezoelectric actuators 24a. As shown in FIG. 7A for example, when, the pitch is large, the deformation of the semiconductor substrate 11 by the piezoelectric actuators 24a cannot fully correct the undulation of the surface part 11c of the semiconductor substrate 11, and the required accuracy in cutting amount cannot be satisfied.

Figure 7B:
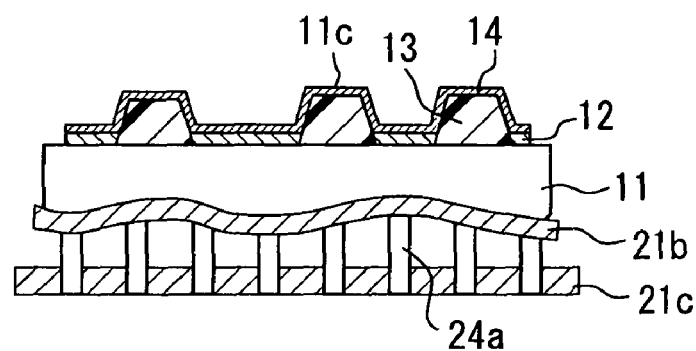

As shown in FIG. 7B for example, when the pitch of the piezoelectric actuators 24a is small, the deformation of the semiconductor substrate 11 by the piezoelectric actuators 24a can correct the undulation of the surface part 11c of the semiconductor substrate 11, and the required accuracy in cutting amount can be satisfied. However, as the pitch of the piezoelectric actuators 24a is decreased, the number of piezoelectric actuators 24a is increased. The increase in the number of piezoelectric actuators 24a leads to complication of a control system, resulting in a cost increase.

Figure 7C:
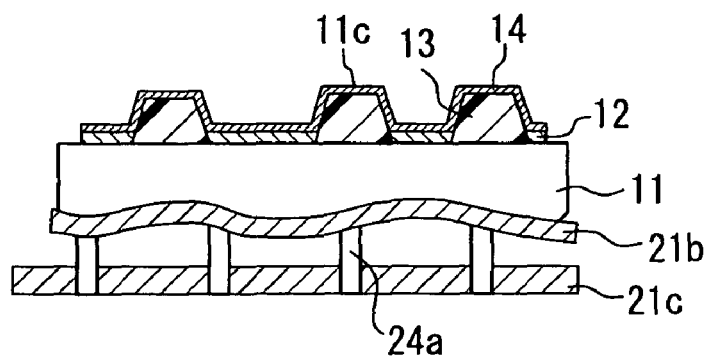

Therefore, as shown in FIG. 7C, it may be preferable to set the pitch of the piezoelectric actuators 24a as large as possible while the undulation of the surface part 11c of the semiconductor substrate 11 can be corrected to an extent that the required accuracy in cutting amount is satisfied when the semiconductor substrate 11 is deformed by the piezoelectric actuators 24a.

In view of the foregoing, the inventors of the present application have studied a relationship between a pitch of piezoelectric actuators 24a and undulation of the surface part 11c of the deformed semiconductor substrate 11. Specifically, a thickness distribution of the semiconductor substrate 11 was measured, and the measured thickness distribution was Fourier-transformed into spatial frequency, and analysis of the spatial frequency is conducted. Then, on a basis of a result of the analysis and on an assumption of the pitch of the piezoelectric actuators 24a, calculation was made as to how the undulation of the surface part 11c of the semiconductor substrate 11 can be corrected in this assumed pitch of the piezoelectric actuators 24a. Thereby, a relationship between the pitch and an error width (i.e., a degree of the undulation that cannot be corrected and that still remains uncorrected after the correction) was investigated in detail. Results and steps of the studies will be more specifically described below.

Figure 8:
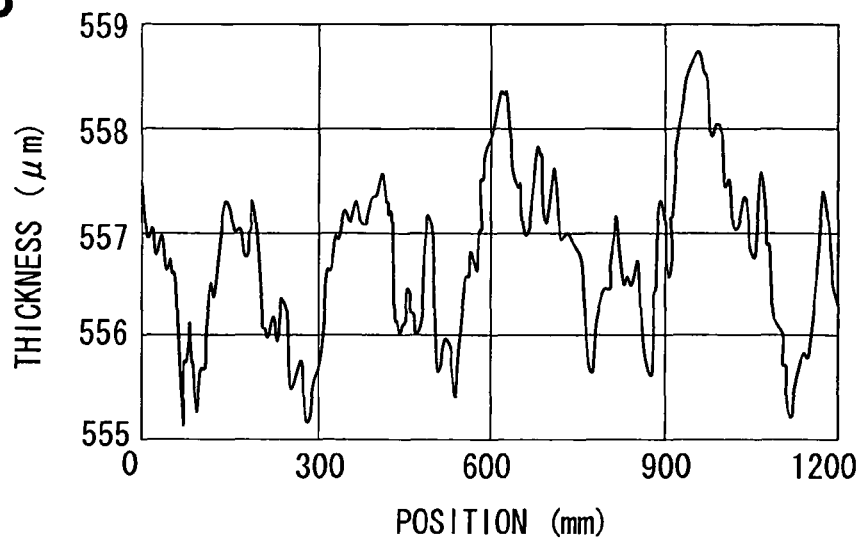
FIG. 8 is a diagram illustrating data about a thickness distribution of a semiconductor substrate.
Figure 9:
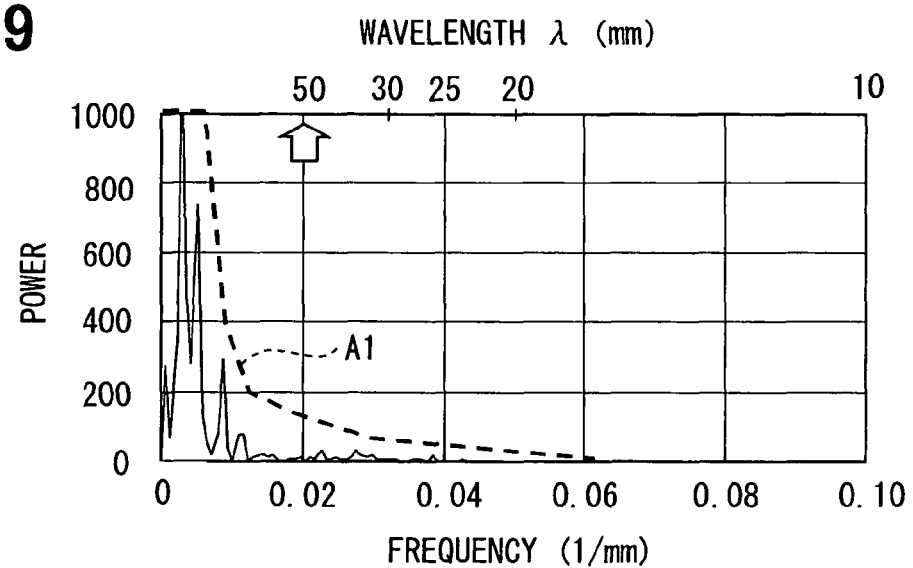
FIG. 9 is a diagram illustrating data about spatial frequency obtained by Fourier transform on the data of FIG. 8.
Figure 10:
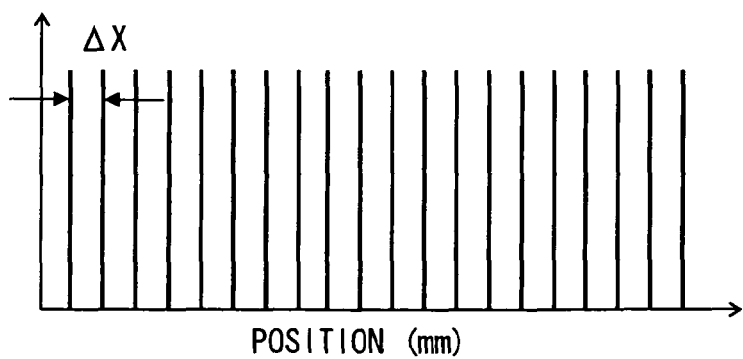
FIG. 10 is a diagram illustrating arrangement of piezoelectric actuators.
Figure 11:
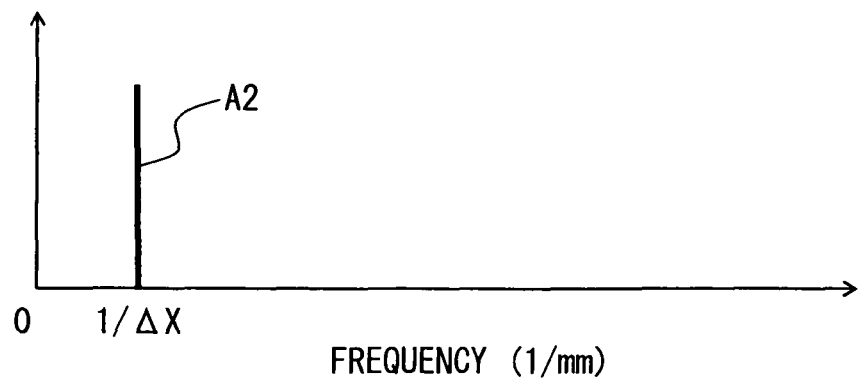
FIG. 11 is a diagram illustrating data about spatial frequency obtained by Fourier transform on the data of FIG. 10.
Figure 12:
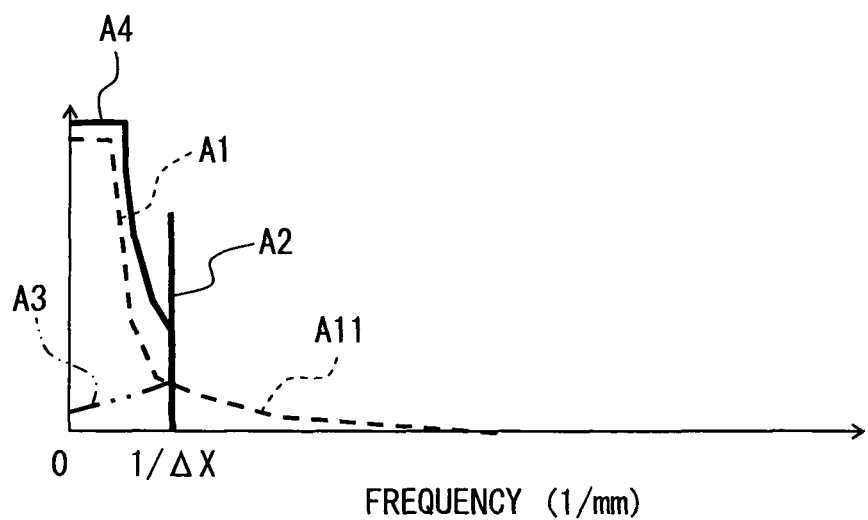
FIG. 12 is a diagram illustrating data obtained by convolution on the data of FIG. 9 and the data of FIG. 11.
Figure 13:
FIG. 13 is a diagram illustrating an error derived from FIG. 12.
Figure 14:
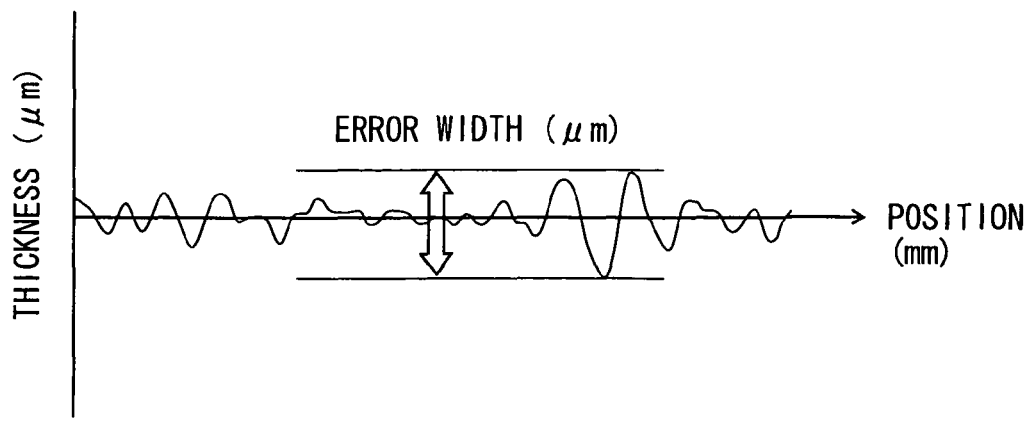
FIG. 14 is a diagram illustrating data obtained by inverse-Fourier transform on the data of FIG. 13.
Figure 15:
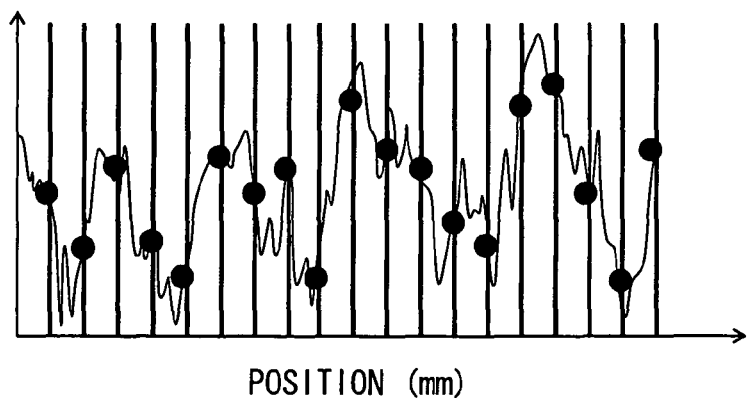
FIG. 15 is a diagram illustrating points obtained by inverse-Fourier transform on information A4 of FIG. 12, so that the points are superimposed on the data of FIG. 8 and the data of FIG. 10.
Figure 16:
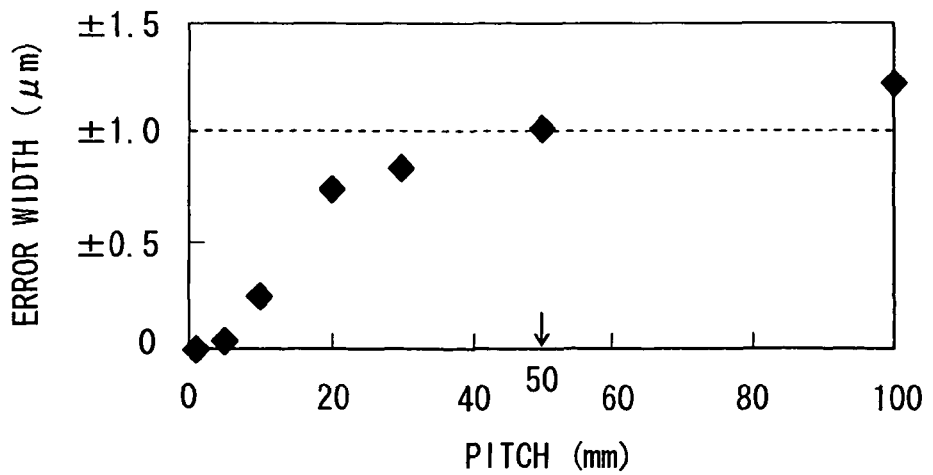
FIG. 16 is a diagram illustrating a relationship between a width of error and a pitch of piezoelectric actuators.
Figure 17:
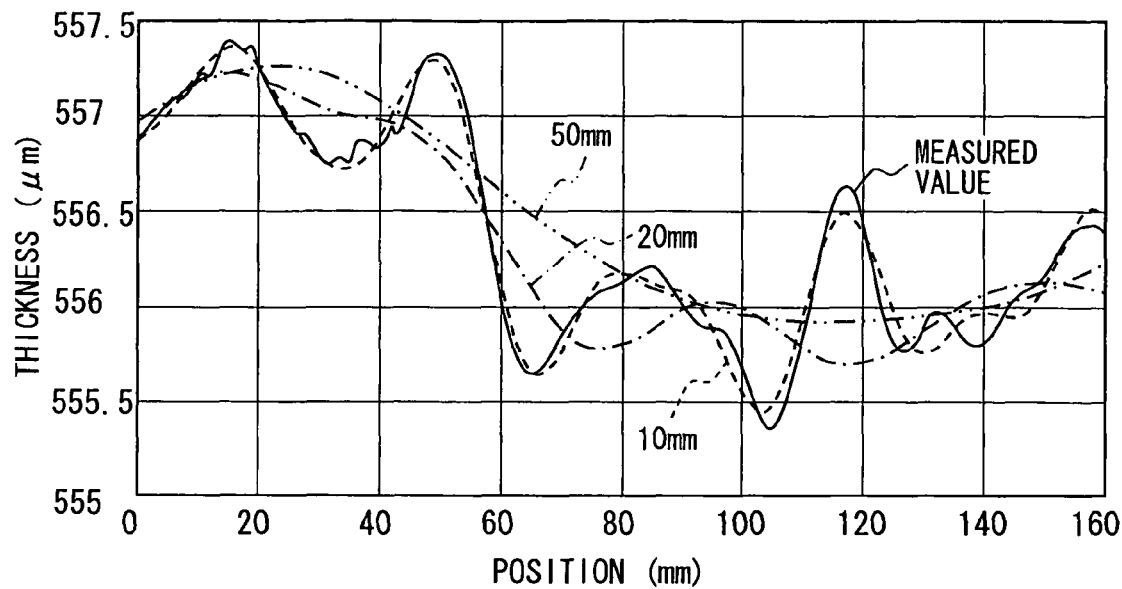
FIG. 17 is a diagram illustrating a measured value of undulation of a surface part of an uncorrected semiconductor substrate and a result of calculation for reproducing the undulation on an assumption of a pitch of piezoelectric actuators.

FIG. 8 is a graph illustrating thickness distribution of the semiconductor substrate. FIG. 9 is a graph illustrating data about spatial frequency which is obtained by Fourier transform on the data of FIG. 8. FIG. 10 is a graph illustrating an arrangement of piezoelectric actuators. FIG. 11 is a graph illustrating data about spatial frequency which is obtained by Fourier transform on the data of FIG. 10. FIG. 12 is a graph illustrating convolution of the data of FIG. 9 and that of FIG. 11. FIG. 13 is a graph illustrating an error derived from FIG. 12. FIG. 14 is a graph illustrating data which is obtained by inverse Fourier transform on the data of FIG. 13. FIG. 15 is a diagram illustrating points which are obtained by inverse Fourier transform on information "A4" shown in FIG. 14. In FIG. 15, the obtained points are superimposed on the data shown in FIG. 8 and that shown in FIG. 10. FIG. 16 is a graph illustrating a relationship between the pitch of the piezoelectric actuators and the error width. FIG. 17 is a graph illustrating an actually-measured value and a calculation result of the undulation of the semiconductor substrate after the correction.

The undulation (i.e., the concavo-convex difference) of a surface part 11c of a semiconductor substrate 11 used in the studies is 7.5 μm in 8σ, like the undulation of the above-described semiconductor substrate 11 is. To simplify measurements, a semiconductor substrate 11 (i.e., a semiconductor wafer) in which a bed electrode 12, a protective film 13 and a metallic film 14 are formed to cover a whole principle surface 11a is prepared: A whole surface of the metallic film 14 of the prepared semiconductor substrate 11 is assumed to correspond to the surface part 11c.

First, the thickness distribution of the semiconductor substrate 11 is measured. In the measuring the thickness distribution, the semiconductor substrate 11 is placed on the adsorption surface 21a of the adsorption stage 21b. With the semiconductor substrate 11 being adsorbed and fixed on the adsorption surface 21a, the laser displacement meter acting as the surface shape measurement device 23 scans along one direction (e.g., X direction) parallel to the adsorption surface 21a, thereby conducting the measurement. More specifically, the laser displacement meter conducts the measurement in states of the presence and absence of the semiconductor substrate 11, and thereby obtaining a thickness of the center of the semiconductor substrate 11 on a scanning line of the laser displacement meter. Then, by referring to the obtained thickness at the center, the laser displacement meter measures thicknesses of the semiconductor substrate 11 at places other than that at the center of the scanning line. A result of the measurement is shown in FIG. 8.

Then, the data shown in FIG. 8 is Fourier-transformed into data of frequency component and its power. A result of the Fourier transformation is shown in FIG. 9. As shown in FIG. 9, it is perceived that the undulation of the surface part 11c of the semiconductor substrate 11 does not have high-frequency components. It was revealed that: a majority is low-frequency components whose frequencies are less than or equal to 0.02 (1/mm); and a minimum wavelength of the spatial frequency is 50 mm. The dashed line A1 in FIG. 9 schematically represents the waveform (shown by the solid line) so that the dashed line A1 includes an error.

It is assumed that multiple piezoelectric actuators 24a are arranged at a pitch of ΔX on a line along which the laser displacements meter scans the semiconductor substrate 11. The arrangement of multiple piezoelectric actuators 24a is Fourier-transformed into frequency component data, as shown in FIG. 10. In this case, the frequency of the frequency component is 1/ΔX, as shown in FIG. 11. The line A2 represents this frequency component having a frequency of 1/ΔX.

Then, a convolution operation, which is a mathematical operation known as convolution, is performed on two data; the data of the spatial frequency representing the thickness distribution of the semiconductor substrate 11 (e.g. the data shown in FIG. 9); and the data of the spatial frequency representing the arrangement of the piezoelectric actuators (e.g., the data shown in FIG. 11), as shown in FIG. 12. The information A4 shown in FIG. 12 is obtained. In addition, a degree of the undulation of the surface part 11c after the undulation is corrected with the piezoelectric actuators 24a arranged at the predetermined pitched is obtained. That is, a degree of the undulation that cannot be corrected and that still remains is obtained. The degree of the undulation that cannot be corrected and that still remains is referred to also as an error.

When the piezoelectric actuators 24a are arranged according to the spatial frequency shown in the line A2, the frequency components representing the thickness distribution of the semiconductor substrate 11 are expressed as the line A1, as shown in FIG. 12. A line A11 in FIG. 12 is a part of the line A1 and represents frequency components whose frequencies are larger than that of the line A2, which represents the arrangement of the piezoelectric actuators 24a. The line A11 represents the error, i.e., the degree of the undulation that cannot be corrected after the correction and that remains after the correction. The line A3 is a line obtained by folding the line A11 with respect to the line A2. The line A3 indicates the above-mentioned error.

The line A4 is a sum of the line A1 and the line A3 in a frequency range smaller than the frequency of the line A2. The line A4 represents certain information (also referred as obtained information), which indicates frequency components of the undulation that has been corrected by the piezoelectric actuators arranged at a predetermined pitch and that includes the error. That is, the line A3 is a difference between the line A4 and the line A3, and indicates the above-described error.

FIG. 13, shows the data (i.e., the line A3) indicating the error, i.e., the undulation of the surface part 11c after the correction. By the inverse Fourier transform on the data of the error, the data of the error can be transformed into a relationship between position and thickness, as shown in FIG. 14. A difference between a maximum value and a minimum value of the waveform in FIG. 14 indicates a width of the error, which still remains uncorrected after the correction is made using the piezoelectric actuators 24a arranged at the predetermined pitch. FIG. 14 illustrates a result in a case where the pitch ΔX of the piezoelectric actuators 24a is set to 20 mm.

FIG. 15 illustrate a graph in which three data are superimposed; first data is positional data about the thickness distribution of the semiconductor substrate 11 shown in FIG. 8;

second data is positional data about the arrangement of the piezoelectric actuators 24a shown in FIG. 10; third data is such one obtained by the inverse Fourier-transform on the line A4 (i.e., the obtained information) shown in FIG. 12. In FIG. 15, a difference between the first data and the third data at each position of the piezoelectric actuator 24a corresponds to the error. A difference in value between the maximum and minimum differences between the first data and the third data indicates the width of the error. Thus, through performing the inverse-Fourier transform on the obtained information (i.e., the line A4). It is also possible obtain the width of the error shown in FIG. 14.

Then, the pitch ΔX of the piezoelectric actuators 24a is set as a variable, and the above-described width of the error is obtained as a function of the pitch ΔX. FIG. 16 is a graph illustrating the width of the error as a function of the pitch ΔX. As shown in FIG. 16, it is found that when the pitch ΔX of the piezoelectric actuators 24a is less than or equal to 50 mm, that is, when the pitch ΔX of the piezoelectric actuators 24a is less than or equal to a minimum wavelength (50 mm) in the spatial frequency of the undulations of the surface part 11c of the semiconductor substrate 11 before the deformation, the error width can fall within +/−1 μm (i.e., a 2 μm width). That is, when the pitch ΔX of the piezoelectric actuators 24a is set less than or equal to 50 mm, it is possible to deform the semiconductor substrate 11 so that the error width falls within the required accuracy (e.g., +/−1 μm) in cutting amount.

FIG. 17 shows an actually-measured value of the uncorrected undulation of the surface part 11c of the semiconductor substrate 11. FIG. 17 further shows results of reproduction of the above undulation by calculations made on the assumption of the arrangement of the piezoelectric actuators 24a. The actually-measured value is shown by the solid line. The calculation result when the pitch of the piezoelectric actuators 24a is 10 mm is shown by the dashed line. The calculation result when the pitch of the piezoelectric actuators 24a is 20 mm is shown by the dotted dashed line. The calculation result when the pitch of the piezoelectric actuators 24a is 50 mm is shown by the two-doted dashed line. The measured value was acquired with an electrostatic capacitance type thickness meter with sampling pitch of 0.4 mm. As shown in FIG. 17, as the pitch of the piezoelectric actuators 24a is smaller, the waveform is closer to the measured value. When the pitch is 10 mm, the waveform substantially matches the measured value. Even when the pitch is 50 mm, a difference between the waveform and the measured value falls within 2 μm. From this result also, it is clear that when the pitch ΔX of the piezoelectric actuators 24a is less than or equal to 50 mm, it is possible to deform the semiconductor substrate 11 so that the undulation of the deformed semiconductor substrate 11 falls within the required accuracy (e.g., +/−1 μm) in cutting amount.

According to a known sampling theorem, when the piezoelectric actuators 24a are arranged at a pitch less than or equal to one-half of wavelength of spatial frequency of the undulation of the surface part 11c, the undulation can be reconstructed. That is, when the piezoelectric actuators 24a are arranged ideally based on the sampling theorem in order to make the high accuracy correction on the undulation, an upper limit of the pitch of the piezoelectric actuators 24a is one-half of wavelength of spatial frequency of the undulation of the semiconductor substrate 11. Therefore, when the arrangement is based on the sampling theorem, the pitch of the piezoelectric actuators 24a is less than or equal to 25 mm.

In contrast, according to the present embodiment, when the pitch of the piezoelectric actuators 24a is set larger than one-half of the minimum wavelength of spatial frequency of the undulation of the surface part 11c of the un-deformed semiconductor substrate 11, the width of the error can fall within +/−1 μm (2 μm width). That is, when the minimum wavelength is 50 mm, the pitch of the piezoelectric actuators 24a can be set larger than 25 mm.

Therefore, in the present embodiment, the pitch of the piezoelectric actuators 24a is set to a value in a range that is larger than one-half of minimum wavelength of spatial frequency of the thickness distribution of the semiconductor substrate 11, and that is less than or equal to the minimum wavelength. Accordingly, it is possible to reduce the number of piezoelectric actuators 24a, as compared to a case of a conventional pitch, which is less than or equal to one-half of wavelength. It is possible to reduce production cost while the required accuracy (e.g. within +/−1 μm) in cutting amount is being satisfied.

Moreover, in the present embodiment, the piezoelectric actuators 24a acting as a deformation means or device are arranged to abut on the rear surface 21g of the adsorption stage 21b, and are configured to apply displacements to the semiconductor substrate 11 via the adsorption stage 21b. Therefore, it is possible to prevent the deformation means or device from generating local stress in the semiconductor substrate 11, and it is possible to prevent the semiconductor substrate 11 from locally deforming.

Moreover, in the present embodiment, before the step of forming the bed electrode 12, the semiconductor substrate 11 is grinded from the rear surface 11b opposite to the principle surface 11a, so that the grinded semiconductor substrate 11 has a predetermined thickness. In this semiconductor substrate 11, the thickness variation of the protection tape is, as described above, transferred to the semiconductor substrate 11, and as a result, the semiconductor substrate 11 can have a thickness variation larger than the required accuracy (e.g., within +/−1 μm) in cutting amount. However, even when the semiconductor substrate 11 has the above thickness variation, the metallic electrode formation method of the present embodiment can reduce production cost while the required accuracy (e.g., within +/−1 μm) in cutting amount is being satisfied.

Moreover, in the present embodiment; an IGBT acting as a vertical transistor element is formed in the semiconductor substrate 11. When this kind of vertical transistor elements, e.g., an IGBT, a MOSFET or the like for power application, is formed, the semiconductor substrate 11 is typically grinded from the rear surface 11b in order to reduce thickness of the semiconductor substrate 11 and reduce an on-state resistance. Thus, the thickness variation of the protection tape is typically transferred to the semiconductor substrate 11, and the semiconductor substrate 11 can typically have a large thickness variation. However, even in cases of the above semiconductor substrates 11, the metallic electrode formation method of the present embodiment can satisfy the required accuracy (e.g., within +/−1 μm) in cutting amount and reduce production cost while the on-state resistance of the vertical transistor element is being reduced.

Second Embodiment

A second embodiment will be described below.

Figure 18:
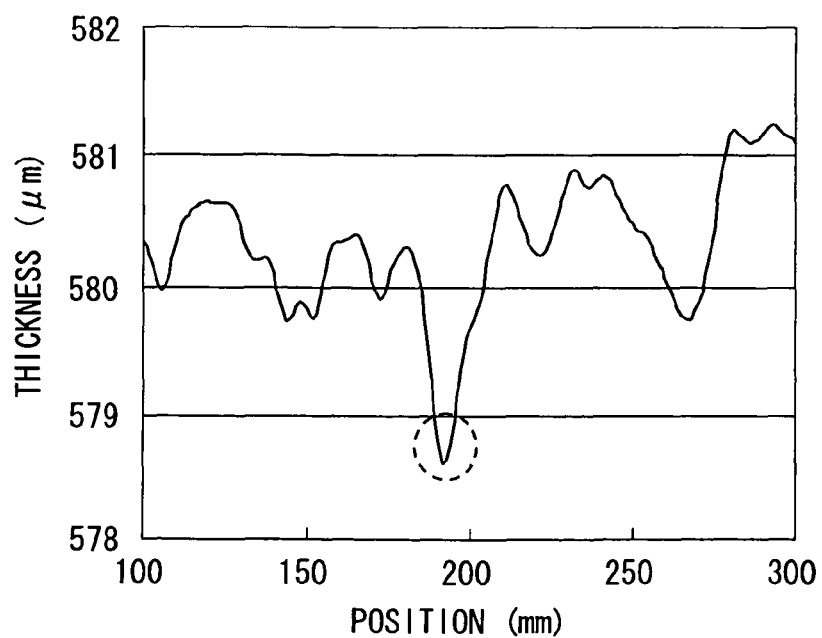
FIG. 18 is a diagram for explanation on an undulation region.

The inventors of the present application have revealed that even when the metallic electrode formation method and the metallic electrode formation apparatus of the first embodiment is used, the required accuracy (+/−1 μm) in cutting amount cannot be satisfied in some cases although these case are rear. A semiconductor substrate 11 that cannot satisfy the required accuracy (+/−1 μm) in cutting amount is found to have a strongly-undulated region, which is outside a range of the required accuracy in cutting work, and which has the undulation equal to or less than one-half or less than one-half of the above-described minimum wavelength, as shown in FIG. 18. That is, the strongly-undulated region of the semiconductor substrate 11 is found to have high-frequency components. In the above, a center of the range of the required accuracy in cutting work is a center between the maximum and minimum values of the thickness distribution and is 580 µm in the case shown in FIG. 18. In FIG. 18, a region surrounded by the dashed line is the above-described strongly-undulated region. The deep-undulation region is also referred to herein as an undulation region.

In the second embodiment, while the pitch of the piezoelectric actuators 24a is being set greater than one-half of the minimum wavelength of the spatial frequency of the thickness distribution of the semiconductor substrate 11 and less than or equal to the minimum wavelength like the pitch in the first embodiment is, the metallic electrode 15 is formed in the following way.

Figure 19:
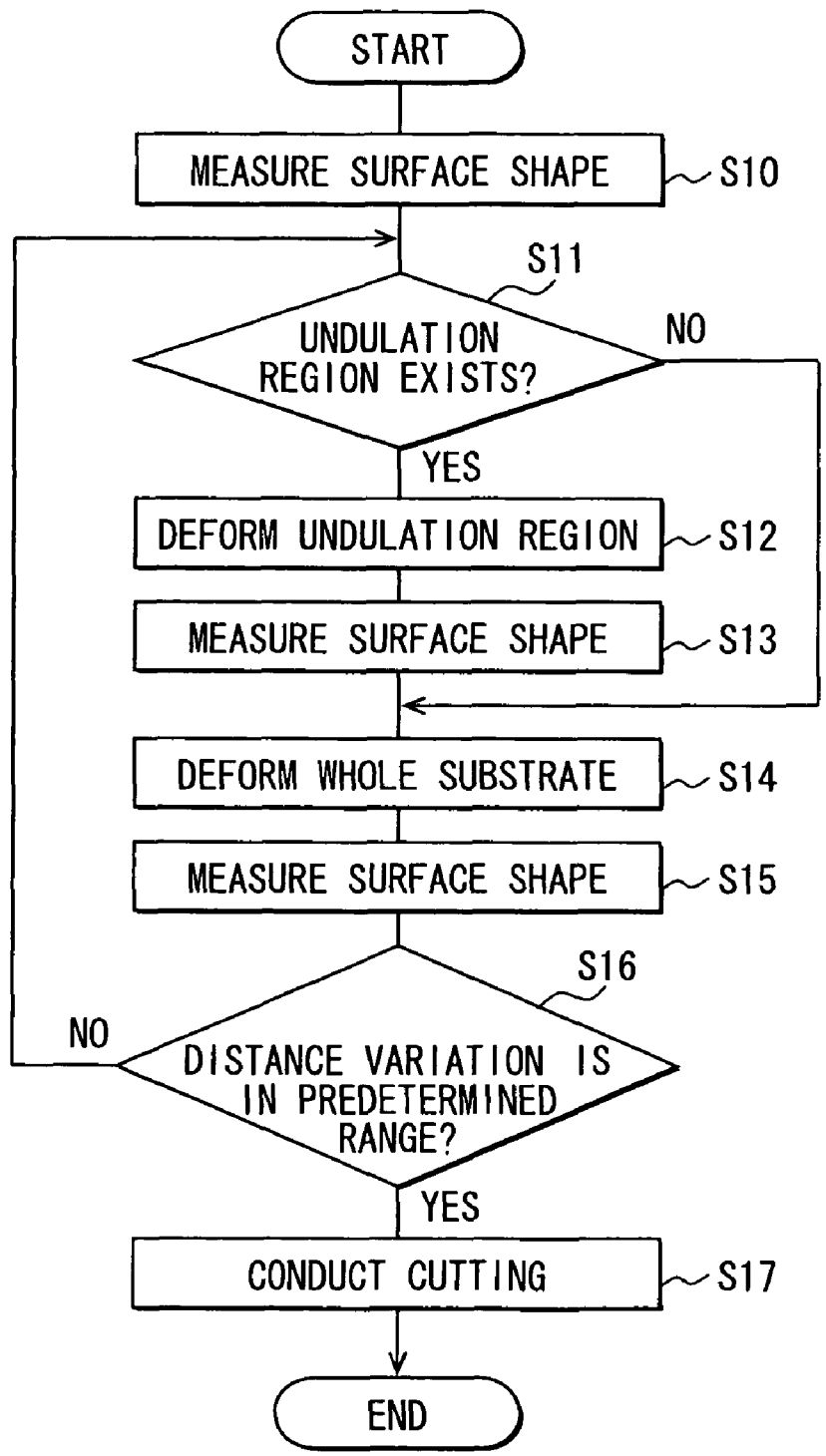
FIG. 19 is a flowchart illustrating a metallic electrode formation method according to a second embodiment.
Figure 20:
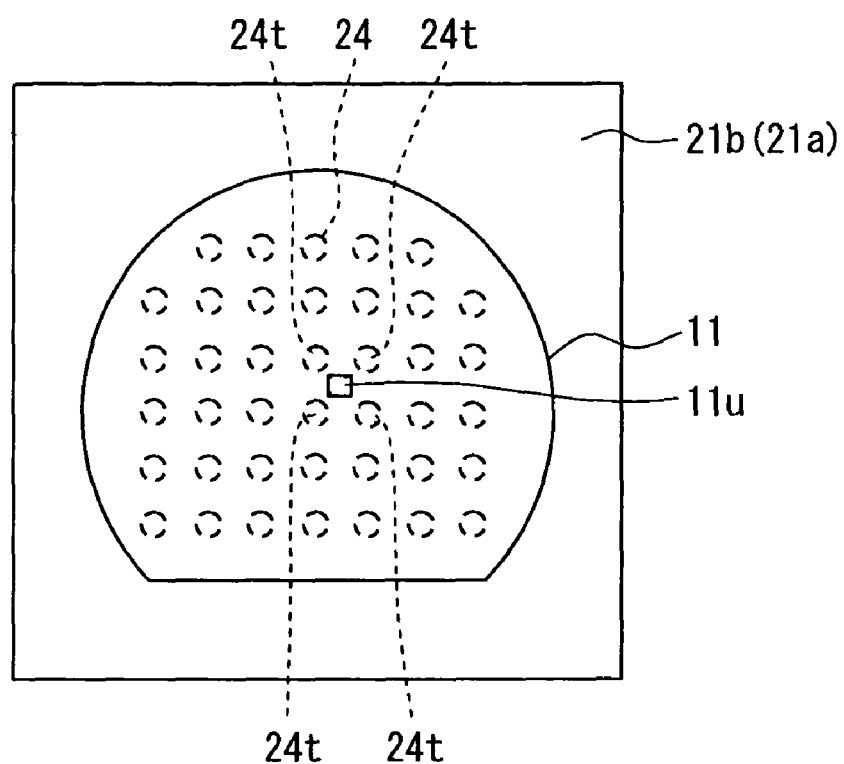
FIG. 20 is a diagram for explanation on a regional deformation step.

FIG. 19 is a flowchart illustrating a metallic electrode formation method of the second embodiment. As shown in FIG. 19, after the metallic film 14 is formed, a step S10 is conducted. At S10, the semiconductor substrate 11 is adsorbed and fixed on the adsorption stage 21b, and the surface shape of the surface part 11c of the semiconductor substrate before being deformed is measured with the surface shape measurement device 23 in order to acquire the data about the surface shape. The steps conducted so far are the same as those of the first embodiment.

At S11, the control computer 25 determines, based on the data about the surface shape acquired at S10, whether the semiconductor substrate 11 has the undulation region, in which the distance between the cutting plane P and the surface part 11c of the semiconductor substrate 11 is outside the range of the required accuracy in cutting work, and in which the undulation is less than or equal to one-half of the above-described minimum wavelength. Therefore, S11 can act as an undulation determination step.

When the control computer 25 determines that the semiconductor substrate 11 has the undulation region, corresponding to YES at S11, the flow proceeds to S12. At S12, the control computer 25 controls amount of displacements of piezoelectric actuators 24a corresponding to the undulation region so that the undulation region falls within the range of the required accuracy in cutting work. Because of the control at S12, the semiconductor substrate 11 is subjected to regional displacement from the rear surface 11b thereof via the adsorption stage 21b. In the case of the undulation region shown in FIG. 18, the displacement is regionally applied to the semiconductor substrate 11 so that a thickness of the undulation region is increased. S12 can act as a regional deformation step.

The number of actuators corresponding to the undulation region is not limited to a specific number. For example, as shown in FIG. 12, when no piezoelectric actuator 24a is located just below an undulation region 11u, four piezoelectric actuators 24t in the vicinity of the undulation region 11u may apply the regional displacement to the semiconductor substrate 11. When one piezoelectric actuator 24 is located just below an undulation region 11u, the one piezoelectric actuator 24 may apply the regional displacement to the semiconductor substrate 11.

After the regional displacement is applied to the semiconductor substrate 11, the surface shape of the surface part 11c of the regionally-deformed semiconductor substrate 11 is measured with the surface shape measurement device 23 at S13. At S14, based on the acquired data about the surface shape, the control computer 25 controls amounts of the displacements of the semiconductor substrate 11 so that the displacements are applied to a whole of the semiconductor substrate 11 from the rear surface 11b via the adsorption stage 21b to totally deform the semiconductor substrate 11. S13 and S14 can act as a total deformation step.

When it is determined at S11 that the semiconductor substrate 11 does not have the undulation region, the control computer 25 controls at S14 amounts of the displacements of the semiconductor substrate 11 based on the data about the surface shape acquired at S10 so that the displacements are applied to a whole of the semiconductor substrate 11 from the rear surface 11b via the adsorption stage 21b to totally deform the semiconductor substrate 11.

After the displacements are applied to a whole of the semiconductor substrate 11, the surface shape of the surface part 11c of the deformed semiconductor substrate 11 is measured with the surface shape measurement device 23 at S15. At S16, the control computer 25 determines whether a variation in distance between the cutting plane P and the surface part 11c is in the range of the required accuracy in cutting work.

When the control computer 25 determines that a variation in distance between the cutting plane P and the surface part 11c is in the range of the required accuracy in cutting work, corresponding to YES at S16, the flow proceeds to S17. At S17, the cutting work is conducted from a surface of the metallic film 14 by using the cutting tool 31 in order to pattern the metallic film 14. Thereby, the metallic electrode 15 is formed.

When the control computer 25 determines that a variation in distance between the cutting plane P and the surface part 11c is not in the range of the required accuracy in cutting work, corresponding to NO at S16, the flow returns to S11 in order to again correct the undulation of the semiconductor substrate 11.

In the present embodiment, as described above, even when the semiconductor substrate 11 has the undulation region, one or more of the piezoelectric actuators corresponding to the undulation region regionally deforms the semiconductor substrate 11 so that the undulation region falls within the range of the required accuracy in cutting work. Then, with the undulation region being corrected, a whole of the semiconductor substrate 11 is totally deformed. In the above, the undulation region is a region that is outside the range of the required accuracy in cutting work and that is less than or equal to one-half of the above-described minimum wavelength.

Since the semiconductor substrate 11 can be deformed in the above-described two steps, even when the undulation region exists, it is possible to reduce the concavo-convex difference of the surface part 11c and it is possible to more reliably place the variation in distance between the cutting plane P and the surface part 11c into the range of the required accuracy in cutting work.

(Modification of Second Embodiment)

A modification of the second embodiment will be described.

Figure 21:
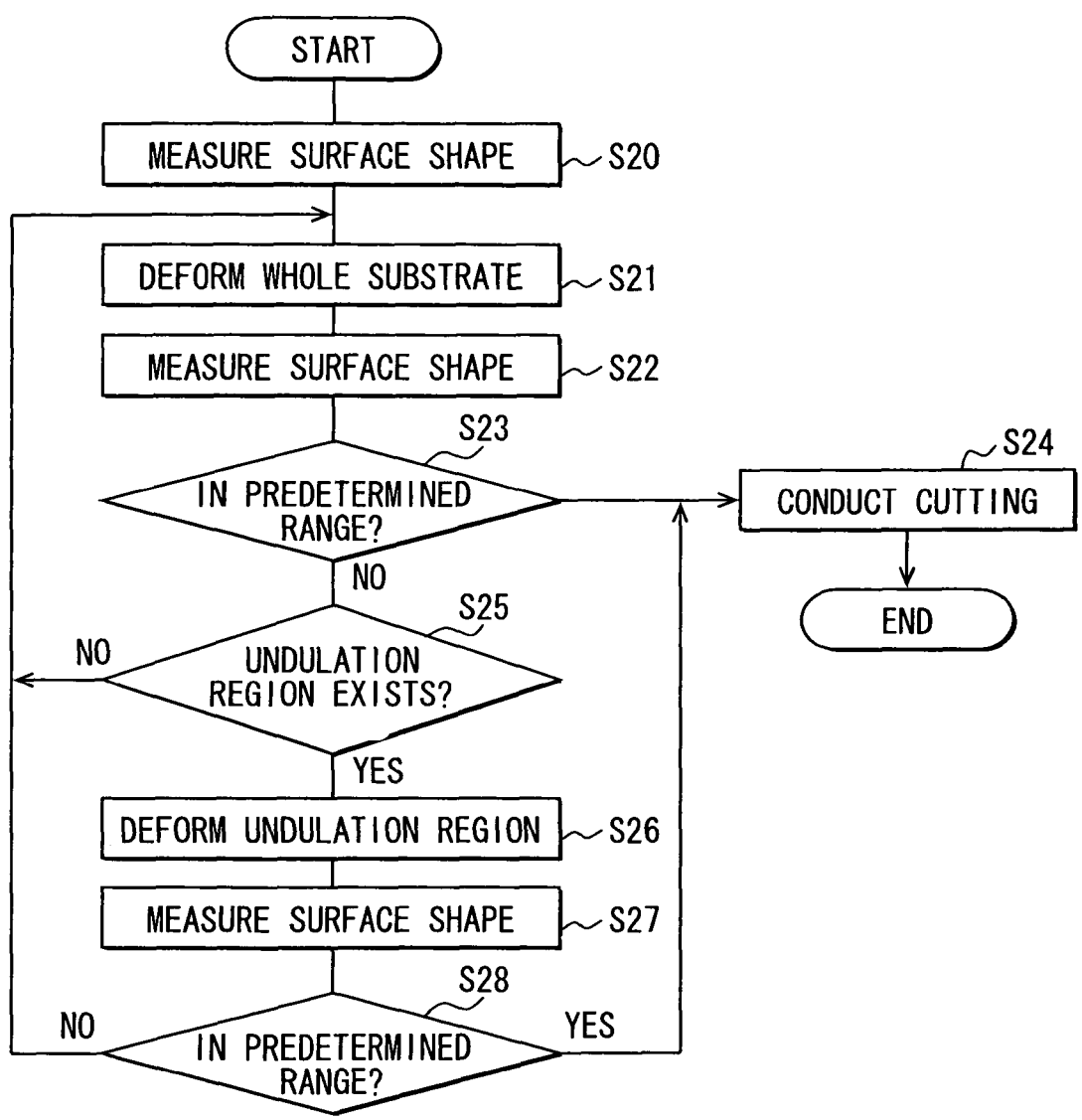
FIG. 21 is a flowchart illustrating a metallic electrode formation method according to a modification of a second embodiment.

In the second embodiment, before a whole of the semiconductor substrate 11 is totally deformed, the undulation region is regionally deformed. In the modification of the second embodiment, after a whole of the semiconductor substrate 11 is totally deformed, the undulation region is regionally deformed. With reference to FIG. 21, a metallic electrode formation method according to the modification of the second embodiment is described below.

As shown in FIG. 21, after the metallic film 14 is formed, S20 is conducted. At S20, the semiconductor substrate 11 is adsorbed and fixed on the adsorption stage 21b, and the surface shape of the surface part 11c of the semiconductor substrate before being deformed is measured with the surface shape measurement device 23 in order to acquire the data about the surface shape. The steps conducted so far are the same as those of the first embodiment.

At S21, based on the acquired data about the surface shape, the control computer 25 controls amounts of displacements of the piezoelectric actuators 24a and the displacements are applied to a whole of the semiconductor substrate 11 to totally deform the semiconductor substrate 11. S21 can act as a total deformation step.

After the displacements are applied to a whole of the semiconductor substrate 11, the flow proceeds to S22. At S22, the surface shape of the surface part 11c of the deformed semiconductor substrate 11 is measured with the surface shape measurement device 23. At S23, the control computer 25 determines whether a variation in distance between the cutting plane P and the surface part 11c is in the range of the required accuracy in cutting work. S22 and S23 can act as a first determination step.

When the control computer 25 determines that the variation in distance between the cutting plane P and the surface part 11c is in the range of the required accuracy in cutting work, corresponding to YES at S23, the flow proceeds to S24. At S24, the cutting work is conducted from a surface of the metallic film 14 by using, the cutting tool 31 in order to pattern the metallic film 14. Thereby, the metallic electrode 15 is formed.

When the control computer 25 determines that the variation in distance between the cutting plane P and the surface part 11c is not in the range of the required accuracy in cutting work, corresponding to NO at S23, the flow proceeds to S25. At S25, based on the data about the surface shape acquired at S22, the control computer 25 determines whether the semiconductor substrate 11 has the undulation region, in which the distance between the cutting plane P and the surface part 11c of the semiconductor substrate 11 is outside the range of the required accuracy in cutting work, and in which the wavelength of the undulation is less than one-half of the above-described minimum wavelength. S25 can correspond to an undulation determination step.

When the control computer 25 determines that the semiconductor substrate 11 has the undulation region, corresponding to YES at S25, the flow proceeds to S26. At S26, the control computer 25 controls amount of displacements of piezoelectric actuators 24a corresponding to the undulation region so that the undulation region falls within the range of the required accuracy in cutting work. Because of the control at S26, the semiconductor substrate 11 is subjected to regional displacement from the rear surface 11b thereof via the adsorption stage 21b. S26 can act as a regional deformation step.

After the regional displacement is applied to the semiconductor substrate 11, the flow proceeds to S27. At S27, the surface shape of the surface part of the deformed semiconductor substrate 11 is measured with the surface shape measurement device 23. At S28, the control computer 25 determines whether a variation in distance between the cutting plane P and the surface part 11c is in the range of the required accuracy in cutting work. S27 and S28 can act as a second determination step.

When the control computer 25 determines that the variation in distance between the cutting plane P and the surface part 11c is in the range of the required accuracy in cutting work, corresponding to YES at S28, the flow proceeds to S24 where the cutting work is conducted from the surface of the metallic film 14 by using the cutting tool 31 in order to pattern the metallic film 14. Thereby, the metallic electrode 15 is formed.

When it is determined at S25 that there is no undulation region and when it is determined at S28 that the variation in distance between the cutting plane P and the surface part 11c is not in the range of the required accuracy in cutting work, corresponding to NO at S25 and S28, the flow returns to S21 in order to again correct the undulation of the semiconductor substrate 11.

In the metallic electrode formation method of the modification of the second embodiment, since the semiconductor substrate 11 can be also deformed in the two steps, it is possible to more reliably place the variation in distance between the cutting plane P and the surface part 11c in the range of the required accuracy in cutting work even when the semiconductor substrate 11 has the undulation region. The undulation region is a region that is outside the range of the required accuracy in cutting amount and that is less than or equal to one-half of the above-described minimum wavelength.

The above embodiments can be modified in various ways, examples of which are described below.

In the above embodiment, the metallic electrode 15 is located inside the opening 13a and has a recession part on a surface thereof. However, a structure and an arrangement of the metallic electrode 15 are not limited to the above example. For example, the metallic electrode 15 may not have the recession part on the surface thereof and may have a flat surface. As described above, when the metallic electrode 15 is located only inside the opening 13a, the metallic electrode 15 can be formed through removing a part of the metallic film 14 located on the upper surface 13b (except the side surface 13c) together with a part of the protective film 13. Therefore, it is possible to simplify manufacturing steps.

In the above embodiment, before the step of forming the bed electrode 12 is conducted, the semiconductor substrate 11 is grinded from the rear surface 1113 opposite to the principle surface 11a, so that the grinded semiconductor substrate 11 has a predetermined thickness. Alternatively, before the step of forming the bed electrode 12, the semiconductor substrate 11 may not be grinded. The metallic electrode formation method may be applied to a not-grinded semiconductor substrate 11 when the thickness variation of the semiconductor substrate 11 adsorbed and fixed on the adsorption stage 21b or the concavo-convex difference of the surface part 11c is larger than the required accuracy in cutting amount.

In the above embodiment, an IGBT acting as an element of the semiconductor device is formed in the semiconductor substrate 11. Alternatively, a vertical power MOSFET may be employed as the element. Alternatively, a lateral element such as LDMOS (lateral diffused MOS), bipolar transistor element and the like may be employed as the element.

In the above embodiments, the piezoelectric actuators 24a are described as an example of actuators. However, the actuators are not limited to the piezoelectric actuators 24a. The use of the piezoelectric actuators 24a may increase accuracy of displacement control, compared to other actuators. The piezoelectric actuators 24a may have advantage in less backlash and small heat generation in operation.

(Aspects)

Embodiments have the following aspects.

According to a first aspect, a formation method of a metallic electrode of a semiconductor device includes: forming a bed electrode on a principle surface of a semiconductor substrate so that the bed electrode is electrically connected with a semiconductor element; forming a protective film covering the bed electrode, and then forming an opening in the protective film, so that a surface of the bed electrode is exposed in the opening; forming a metallic film covering the protective film and the surface of the bed electrode exposed in the opening; mounting the semiconductor substrate having the metallic film to an adsorption stage so that the semiconductor substrate is adsorbed and fixed on the adsorption stage; acquiring data about a surface shape of a surface part of the semiconductor substrate through causing a surface shape measurement device to measure the surface shape of the semiconductor substrate after the semiconductor substrate is adsorbed and fixed on the adsorption stage, wherein the surface part of the semiconductor substrate is a part of the metallic film, the part covering the protective film, wherein the surface shape measurement device is located on a side of the principle surface of the semiconductor substrate; deforming the semiconductor substrate based on the acquired data about the surface shape through causing a deformation device to apply displacement to the fixed semiconductor substrate via the adsorption stage so that a distance between a cutting plane and the surface part of the semiconductor substrate falls within a predetermined range, wherein the cutting plane is set so that the adsorption stage before being deformed is parallel to the cutting plane; determining whether the distance between the cutting plane and the surface part of the deformed semiconductor substrate is in the predetermined range, through letting the surface shape measurement device to measure the surface shape of the surface part of the deformed semiconductor substrate; and forming a metallic electrode through patterning the metallic film when it is determined that the distance between the cutting plane and the surface part of the deformed semiconductor substrate is in the predetermined range, wherein the pattering the metallic film includes conducting a cutting work along the cutting plane, with the deformed semiconductor substrate being adsorbed and fixed to the adsorption stage.

In this formation method, multiple actuators are used as the deformation device. Respective displacements of the multiple actuators are controllable. Further, the multiple actuators are arranged so that the multiple actuators abut on a rear surface of the adsorption stage to apply the displacements to the semiconductor substrate via the adsorption stage and a pitch of the multiple actuators is greater than one-half of minimum wavelength of spatial frequency of a thickness distribution of the semiconductor substrate, and is less than or equal to the minimum wavelength.

In the course of making the present invention, the inventors of the present application measured a thickness variation of a semiconductor substrate in which a metallic film had been formed. Based on a result of this measurement, the inventors revealed a distribution of amplitude of undulation of a surface of the semiconductor substrate, a distribution of wavelength of the undulation, and a distribution of spatial frequency of the undulation. Then, the inventors studied a relationship between a pitch of actuators and the undulation of the surface of the semiconductor substrate. As a result, the inventors have found out that even when the pitch of actuators is less than or equal to one-half of the minimum wavelength of the spatial frequency of the thickness distribution of the semiconductor substrate, it is possible to satisfy the required accuracy in cutting amount. The above formation method and the above metallic electrode formation method are based on these studies. According the above formation method and the above metallic electrode formation method, it is possible to reduce the number of actuators compared to a case where the pitch of actuators is less than or equal to one-half of the minimum wavelength. Therefore, it is possible to reduce production cost while the required accuracy (e.g., within +/−1 μm) in cutting amount is being satisfied. It should be noted that when the pitch of the actuators was larger than the minimum wavelength in the spatial frequencies, the undulation was not fully corrected, and the required accuracy in cutting amount could not be satisfied.

According to the above formation method, it is possible to form the metallic electrode through patterning the metallic film by a cutting work. To conduct the cutting work, the following may be performed. While the semiconductor substrate having the metallic film is being adsorbed and fixed on the adsorption stage, the surface shape measurement device acquires the data about the surface shape of the surface part of the semiconductor substrate and the multiple actuators of the deformation device deforms the semiconductor substrate so that the distance between the cutting plane and the surface part of the semiconductor substrate falls within the predetermined range. Then, the surface shape of the deformed semiconductor substrate is measured with the surface shape measurement device in order to determine whether the distance between the cutting plane and the surface part of the semiconductor substrate is in the predetermined range. When it is determined that the distance between the cutting plane and the surface portion of the semiconductor substrate is in the predetermined range, the cutting work is conducted along the cutting plane in a state where the semiconductor substrate deformed by the deformation device is adsorbed and fixed on the adsorption stage. Therefore, when the surface shape of the semiconductor substrate reflects a shape of the rear surface due to the adsorption and fixation of the semiconductor substrate on the adsorption stage and when a concavo-convex difference of the surface part is increased, it is possible to decrease the concavo-convex difference of the surface part of the semiconductor substrate and it is possible to put the distance between the cut plane and the surface part of the semiconductor substrate in the predetermined range (i.e., the required accuracy in cutting amount).

Moreover, since the deformation device includes the multiple actuators whose respective displacements are controllable, the multiple actuators can apply the displacements to the semiconductor substrate according to a deformation state of the semiconductor substrate. Therefore, it is possible to control the surface shape of the semiconductor substrate with high accuracy.

Moreover, since the multiple actuators of the deformation device are arranged to abut on the rear surface of the adsorption stage and are configured to apply displacements to the semiconductor substrate via the adsorption stage, it is possible to prevent the deformation device from generating local stress in the semiconductor substrate and it is possible to prevent the semiconductor substrate from locally deforming.

According to a second aspect, the deforming the semiconductor substrate may include an undulation determination step, a regional deformation step and a total deformation step. In the undulation determination step, it is determined, based on the data about the surface shape acquired with the surface shape measurement device, whether the semiconductor substrate has an undulation region. The undulation region is a region that is outside the predetermined range and that has undulation corresponding to one-half or less than one-half of the minimum wavelength. In the regional deformation step, the undulation region is deformed by using one or more of the multiple actuators corresponding to the undulation region so that the undulation region falls within the predetermined range. Note that the regional deformation step is preformed when it is determined that the semiconductor substrate has the undulation region. In the total deformation step, the semiconductor substrate is deformed in such manner that: when it is determined that the semiconductor substrate does not have the undulation region, the semiconductor substrate is deformed as a whole based on the data about the surface shape so that the distance between the cutting plane and the surface part of the semiconductor substrate falls within the predetermined range; and when it is determined that the semiconductor substrate has the undulation region, the surface shape of the surface part of the semiconductor substrate deformed at the regional determination step is measured with the surface shape measurement device to acquire measurement data after the regional deformation step is conducted, and the semiconductor substrate is deformed as a whole based on the measurement data so that the distance between the cutting plane and the surface part of the semiconductor substrate falls within the predetermined range.

According to the above formation method, even when the undulation that is outside the predetermined range and that is one-half or less than one-half of the minimum wavelength is generated, the semiconductor device is regionally deformed by using one or more of the actuators corresponding to the undulation region. With the undulation region corrected, a whole of the semiconductor substrate is deformed. Therefore, since the semiconductor substrate can be deformed in the two steps, even the undulation region exists, it is possible to decrease the concavo-convex difference of the surface part of the semiconductor substrate and it is possible to put the distance between the cutting plane and the surface part of the semiconductor substrate in the predetermined range (i.e., the required accuracy in cutting amount). That is, it is possible to more reliably put the distance between the cutting plane and the surface part in the predetermined range (i.e., the required accuracy in cutting amount).

Alternatively, according to a third aspect, the deforming the semiconductor substrate may include a total deformation step of deforming the semiconductor substrate as a whole based on the acquired about the surface shape so that the distance between the cutting plane and the surface part of the semiconductor substrate falls within the predetermined range. The determining may include a first determination step of determining, through measuring the surface shape of the surface part of the semiconductor substrate that has been deformed at the total deformation step, whether the distance between the cutting plane and the surface part of the semiconductor substrate is in the predetermined range. The determining may further include an undulation determination step of determining whether the semiconductor substrate has an undulation region. The undulation determination step is performed when it is determined at the first determination step that the distance is not in the predetermined range. The deforming the semiconductor substrate may further include a regional deformation step of deforming the semiconductor substrate by using one or more of the multiple actuators corresponding to the undulation region so that the undulation region falls within the predetermined range. The regional deformation step is performed when it is determined that the semiconductor substrate has the undulation region. The determining may further include a second determination step of determining, through measuring the surface shape of the surface part of the semiconductor substrate, whether the distance of the cutting plane and the surface part of the deformed semiconductor substrate is in the predetermined range after the regional deformation step is preformed.

According to the above formation method, the semiconductor substrate is first deformed as a whole. When the undulation that is outside the predetermined range and that is one-half or less than one-half of the minimum wavelength is generated in this deformation state, the semiconductor device is regionally deformed by using one or more of the actuators corresponding to the undulation region. Therefore, since the semiconductor substrate can be deformed in the two steps, even the undulation region exists, it is possible to decrease the concavo-convex difference of the surface part of the semiconductor substrate and it is possible to put the distance between the cutting plane and the surface part of the semiconductor substrate in the predetermined range (i.e., the required accuracy in cutting amount). That is, it is possible to more reliably put the distance between the cutting plane and the surface part in the predetermined range (i.e., the required accuracy in cutting amount).

According to a fourth aspect, before the forming the bed electrode, the semiconductor substrate may be grinded from a rear surface of the semiconductor substrate, so that the grinded semiconductor substrate has a predetermined thickness. In the above, the rear surface and the principle surface of the semiconductor substrate are opposite surfaces of the semiconductor substrate. According to this formation method, after at least a principle surface side part of a semiconductor element is formed in the semiconductor substrate, the semiconductor substrate may be grinded from the rear surface thereof with a protection tape being attached to the principle surface of the semiconductor substrate so that the semiconductor substrate is grinded to a predetermined thickness. Since the protection tape may have a thickness variation exceeding the required accuracy in cutting amount, the thickness variation of the protection tape may be transferred to the semiconductor substrate, and the semiconductor substrate may have a thickness variation larger than the required accuracy (within +/−1 µm) in cutting amount. According to the above formation method, even when the semiconductor substrate is grinded with the protection tape being attached to the principle surface, it is possible to reduce the production cost while the required accuracy (within +/−1 µm) in cutting amount is being satisfied.

According to a fifth aspect, the semiconductor element may be a vertical transistor element, in which a current flows in a thickness direction of the semiconductor substrate. The vertical transistor element, e.g., an IGBT or a MOSFET for power application, can have a lower on-state resistance when the semiconductor substrate is thinner. Therefore, the semiconductor substrate is typically grinded from the rear surface thereof in order to decrease the on-state resistance. Therefore, according to the above method formation, while reducing the on-state resistance of the vertical transistor element, it is possible to satisfy the required accuracy (within +/−1 µm) in cutting amount and it is possible to reduce the production cost.

According to a sixth aspect, the multiple actuators may be multiple piezoelectric actuators. When piezoelectric actuators are used, accuracy in displacement control may be enhanced as compared to another actuator. The piezoelectric actuators may have advantage in less backlash and small heat generation in operation.

According to a seventh aspect, the metallic electrode may be formed through patterning the metallic film, so that a part of the metallic film located only inside the opening is left after the patterning in this case, it is possible to form the metallic electrode on a side surface of the protective film. The side surface causes a difference in level between an upper surface of the protective film and a surface of the bed electrode exposed in the opening. Since a part of the metallic film located above the upper surface of the protective is removed by the cutting work and another part of the metallic film located on the side surface is not removed by the cutting work, it is possible to simplify production steps.

According to an eighth aspect, a number of points to be measured by the surface shape measurement device to acquire the data about the surface shape may be larger than a number of multiple actuators. According this manner, since it is possible to measure regions between the multiple actuators, it is possible to improve accuracy of measurement of the surface shape.

According to a ninth aspect, the surface shape measurement device measures at least the surface shape of the surface part corresponding to points to which the plurality of actuators respectively applies the displacements. According the above manner, since it is possible to measure portions supposed to have largest deformation, it is possible to improve accuracy of measurement of the surface shape.

According to a tenth aspect, the surface shape measurement device may be a laser displacement meter that scans along a plane parallel to the cutting plane. According to this manner, it is possible to conduct contactless measurement of the surface shape with high accuracy, and it is possible to shorten a measurement time.

According to an eleventh aspect, metallic electrode formation apparatus for forming a metallic electrode through cutting a metallic film, which is formed to cover a protective film and a bed electrode exposed in an opening of the protective film, along a cutting plane is provided. The bed electrode is on a principle surface of a semiconductor substrate. The metallic electrode formation apparatus includes: an adsorption stage on which the semiconductor substrate is to be adsorbed and fixed; and multiple of actuators arranged to abut on a rear surface of the adsorption stage to apply displacements to the semiconductor substrate via the adsorption stage. The adsorption stage before being deformed is parallel to the cutting plane. The multiple actuators are arranged at a pitch that is greater then one-half of minimum wavelength of spatial frequency of thickness distribution of the semiconductor substrate, and that is less than or equal to the minimum wavelength.

The above metallic electrode formation apparatus can involves advantages that are substantially similar to those that above-described formation method can involve.

Embodiments of the present invention is not limited the above embodiments and modifications thereof. That is, the above embodiments and modifications thereof may be modified in various ways without departing from the sprit and scope of the invention.

What is claimed is:

1. A formation method of a metallic electrode of a semiconductor device, comprising:
   forming a bed electrode on a principle surface of a semiconductor substrate so that the bed electrode is electrically connected with a semiconductor element;
   forming a protective film covering the bed electrode, and then forming an opening in the protective film, so that a surface of the bed electrode is exposed in the opening;
   forming a metallic film covering the protective film and the surface of the bed electrode exposed in the opening;
   mounting the semiconductor substrate having the metallic film to an adsorption stage so that the semiconductor substrate is adsorbed and fixed on the adsorption stage;
   acquiring data about a surface shape of a surface part of the semiconductor substrate through causing a surface shape measurement device to measure the surface shape of the semiconductor substrate after the semiconductor substrate is adsorbed and fixed on the adsorption stage, wherein the surface part of the semiconductor substrate is a part of the metallic film, the part covering the protective film, wherein the surface shape measurement device is located on a side of the principle surface of the semiconductor substrate;
   deforming the semiconductor substrate based on the acquired data about the surface shape through causing a deformation device to apply displacement to the fixed semiconductor substrate via the adsorption stage so that a distance between a cutting plane and the surface part of the semiconductor substrate falls within a predetermined range, wherein the cutting plane is set so that the adsorption stage before being deformed is parallel to the cutting plane;
   determining whether the distance between the cutting plane and the surface part of the deformed semiconductor substrate is in the predetermined range, through letting the surface shape measurement device to measure the surface shape of the surface part of the deformed semiconductor substrate;
   forming a metallic electrode through patterning the metallic film when it is determined that the distance between the cutting plane and the surface part of the deformed semiconductor substrate is in the predetermined range, wherein the pattering the metallic film includes conducting a cutting work along the cutting plane, with the deformed semiconductor substrate being adsorbed and fixed to the adsorption stage;
   using a plurality of actuators as the deformation device, respective displacements of the plurality of actuators being controllable; and
   arranging the plurality of actuators so that
      the plurality of actuators abuts on a rear surface of the adsorption stage to apply the displacements to the semiconductor substrate via the adsorption stage and
      a pitch of the plurality of actuators is greater than one-half of minimum wavelength of spatial frequency of a thickness distribution of the semiconductor substrate, and is less than or equal to the minimum wavelength.

2. The formation method according to claim 1, further comprising:
   before the forming the bed electrode, grinding the semiconductor substrate from a rear surface of the semiconductor substrate, so that the grinded semiconductor substrate has a predetermined thickness, wherein the rear surface and the principle surface of the semiconductor substrate are opposite surfaces of the semiconductor substrate.

3. The formation method according to claim 2, wherein:
the semiconductor element is a vertical transistor element, in which a current flows in a thickness direction of the semiconductor substrate.

4. The formation method according to claim 1, wherein:
the plurality of actuators is a plurality of piezoelectric actuators.

5. The formation method according to claim 1, wherein:
the metallic electrode is formed through patterning the metallic film, so that a part of the metallic film located only inside the opening is left after the patterning.

6. The formation method according to claim 1, wherein:
a number of points to be measured by the surface shape measurement device to acquire the data about the surface shape is larger than a number of said actuators.

7. The formation method according to claim 1, wherein:
the surface shape measurement device measures at least the surface shape of the surface part corresponding to points to which the plurality of actuators respectively applies the displacements.

8. The formation method according to claim 1, wherein:
the surface shape measurement device is a laser displacement meter that scans along a plane parallel to the cutting plane.

9. A formation method of a metallic electrode of a semiconductor device, comprising:
forming a bed electrode on a principle surface of a semiconductor substrate so that the bed electrode is electrically connected with a semiconductor element;
forming a protective film covering the bed electrode, and then forming an opening in the protective film, so that a surface of the bed electrode is exposed in the opening;
forming a metallic film covering the protective film and the surface of the bed electrode exposed in the opening;
mounting the semiconductor substrate having the metallic film to an adsorption stage so that the semiconductor substrate is adsorbed and fixed on the adsorption stage;
acquiring data about a surface shape of a surface part of the semiconductor substrate through causing a surface shape measurement device to measure the surface shape of the semiconductor substrate after the semiconductor substrate is adsorbed and fixed on the adsorption stage, wherein the surface part of the semiconductor substrate is a part of the metallic film, the part covering the protective film, wherein the surface shape measurement device is located on a side of the principle surface of the semiconductor substrate;
deforming the semiconductor substrate based on the acquired data about the surface shape through causing a deformation device to apply displacement to the fixed semiconductor substrate via the adsorption stage so that a distance between a cutting plane and the surface part of the semiconductor substrate falls within a predetermined range, wherein the cutting plane is set so that the adsorption stage before being deformed is parallel to the cutting plane;
determining whether the distance between the cutting plane and the surface part of the deformed semiconductor substrate is in the predetermined range, through letting the surface shape measurement device to measure the surface shape of the surface part of the deformed semiconductor substrate;
forming a metallic electrode through patterning the metallic film when it is determined that the distance between the cutting plane and the surface part of the deformed semiconductor substrate is in the predetermined range, wherein the pattering the metallic film includes conducting a cutting work along the cutting plane, with the deformed semiconductor substrate being adsorbed and fixed to the adsorption stage;
using a plurality of actuators as the deformation device, respective displacements of the plurality of actuators being controllable; and
arranging the plurality of actuators so that
the plurality of actuators abuts on a rear surface of the adsorption stage to apply the displacements to the semiconductor substrate via the adsorption stage and
a pitch of the plurality of actuators is greater than one-half of minimum wavelength of spatial frequency of a thickness distribution of the semiconductor substrate, and is less than or equal to the minimum wavelength, wherein:
the deforming the semiconductor substrate includes:
an undulation determination step of determining, based on the data about the surface shape acquired with the surface shape measurement device, whether the semiconductor substrate has an undulation region, which is outside the predetermined range and which has undulation corresponding to one-half or less than one-half of the minimum wavelength;
a regional deformation step of deforming the undulation region by using one or more of the plurality of actuators corresponding to the undulation region so that the undulation region falls within the predetermined range, wherein the regional deformation step is preformed when it is determined that the semiconductor substrate has the undulation region; and
a total deformation step of deforming the semiconductor substrate in such manner that:
when it is determined that the semiconductor substrate does not have the undulation region, the semiconductor substrate is deformed as a whole based on the data about the surface shape so that the distance between the cutting plane and the surface part of the semiconductor substrate falls within the predetermined range; and
when it is determined that the semiconductor substrate has the undulation region, (i) the surface shape of the surface part of the semiconductor substrate deformed at the regional determination step is measured with the surface shape measurement device to acquire measurement data after the regional deformation step is conducted, and (ii) the semiconductor substrate is deformed as a whole based on the measurement data so that the distance between the cutting plane and the surface part of the semiconductor substrate falls within the predetermined range.

10. A formation method of a metallic electrode of a semiconductor device, comprising:
forming a bed electrode on a principle surface of a semiconductor substrate so that the bed electrode is electrically connected with a semiconductor element;
forming a protective film covering the bed electrode, and then forming an opening in the protective film, so that a surface of the bed electrode is exposed in the opening;
forming a metallic film covering the protective film and the surface of the bed electrode exposed in the opening;
mounting the semiconductor substrate having the metallic film to an adsorption stage so that the semiconductor substrate is adsorbed and fixed on the adsorption stage;
acquiring data about a surface shape of a surface part of the semiconductor substrate through causing a surface shape measurement device to measure the surface shape of the semiconductor substrate after the semiconductor substrate is adsorbed and fixed on the adsorption stage, wherein the surface part of the semiconductor substrate is a part of the metallic film, the part covering the protective film, wherein the surface shape measurement device is located on a side of the principle surface of the semiconductor substrate;
deforming the semiconductor substrate based on the acquired data about the surface shape through causing a deformation device to apply displacement to the fixed semiconductor substrate via the adsorption stage so that a distance between a cutting plane and the surface part of the semiconductor substrate falls within a predetermined range, wherein the cutting plane is set so that the adsorption stage before being deformed is parallel to the cutting plane;
determining whether the distance between the cutting plane and the surface part of the deformed semiconductor substrate is in the predetermined range, through letting the surface shape measurement device to measure the surface shape of the surface part of the deformed semiconductor substrate;

forming a metallic electrode through patterning the metallic film when it is determined that the distance between the cutting plane and the surface part of the deformed semiconductor substrate is in the predetermined range, wherein the pattering the metallic film includes conducting a cutting work along the cutting plane, with the deformed semiconductor substrate being adsorbed and fixed to the adsorption stage;

using a plurality of actuators as the deformation device, respective displacements of the plurality of actuators being controllable; and arranging the plurality of actuators so that
the plurality of actuators abuts on a rear surface of the adsorption stage to apply the displacements to the semiconductor substrate via the adsorption stage and
a pitch of the plurality of actuators is greater than one-half of minimum wavelength of spatial frequency of a thickness distribution of the semiconductor substrate, and is less than or equal to the minimum wavelength, wherein:

the deforming the semiconductor substrate includes a total deformation step of deforming the semiconductor substrate as a whole based on the acquired about the surface shape so that the distance between the cutting plane and the surface part of the semiconductor substrate falls within the predetermined range;

the determining includes a first determination step of determining, through measuring the surface shape of the surface part of the semiconductor substrate that has been deformed at the total deformation step, whether the distance between the cutting plane and the surface part of the semiconductor substrate is in the predetermined range;

the determining further includes an undulation determination step of determining whether the semiconductor substrate has an undulation region, wherein the undulation region is a region that is outside the predetermined range and that has undulation corresponding to one-half or less than one-half of the minimum wavelength, wherein the undulation determination step is performed when it is determined at the first determination step that the distance is not in the predetermined range;

the deforming the semiconductor substrate further includes a regional deformation step of deforming the semiconductor substrate by using one or more of the plurality of actuators corresponding to the undulation region so that the undulation region falls within the predetermined range, wherein the regional deformation step is performed when it is determined that the semiconductor substrate has the undulation region; and the determining further includes a second determination step of determining, through measuring the surface shape of the surface part of the semiconductor substrate, whether the distance of the cutting plane and the surface part of the deformed semiconductor substrate is in the predetermined range after the regional deformation step is preformed.

* * * * *